United States Patent
Chikazawa et al.

(10) Patent No.: US 8,199,524 B2
(45) Date of Patent: Jun. 12, 2012

(54) ELECTRONIC DEVICE AND METAL PLATE MEMBER

(75) Inventors: Nagahisa Chikazawa, Kawasaki (JP); Katsumi Adachi, Kato (JP)

(73) Assignee: Fujitsu Limited, Kawasaki (JP)

( * ) Notice: Subject to any disclaimer, the term of this patent is extended or adjusted under 35 U.S.C. 154(b) by 797 days.

(21) Appl. No.: 11/785,762

(22) Filed: Apr. 19, 2007

(65) Prior Publication Data

US 2008/0080128 A1    Apr. 3, 2008

(30) Foreign Application Priority Data

Sep. 28, 2006  (JP) .................. 2006-265961

(51) Int. Cl.
*H05K 7/14* (2006.01)
*H05K 7/18* (2006.01)

(52) U.S. Cl. .............. 361/799; 361/807; 361/810

(58) Field of Classification Search .................. 361/752, 361/799, 728–730, 796, 800, 807, 810; 174/35 R, 174/51, 250
See application file for complete search history.

(56) References Cited

U.S. PATENT DOCUMENTS

| | | | | |
|---|---|---|---|---|
| 4,780,570 A | * | 10/1988 | Chuck | 174/369 |
| 5,876,223 A | * | 3/1999 | Kaneshige et al. | 439/108 |
| 6,049,469 A | * | 4/2000 | Hood et al. | 361/818 |
| 6,063,999 A | * | 5/2000 | Kelly | 174/351 |
| 6,115,243 A | * | 9/2000 | Horii | 361/679.09 |
| 6,118,672 A | * | 9/2000 | Yamauchi et al. | 361/818 |
| 6,157,538 A | * | 12/2000 | Ali et al. | 361/704 |
| 6,473,296 B2 | * | 10/2002 | Amemiya et al. | 361/679.27 |
| 6,728,105 B2 | * | 4/2004 | Tanaka | 361/704 |
| 7,113,061 B2 | * | 9/2006 | Ootori et al. | 334/85 |
| 7,554,815 B2 | * | 6/2009 | Hardt et al. | 361/753 |
| 7,701,724 B2 | * | 4/2010 | Tanaka et al. | 361/752 |
| 2004/0042184 A1 | * | 3/2004 | Tomioka | 361/752 |

FOREIGN PATENT DOCUMENTS

JP    2005-075301    3/2005

* cited by examiner

*Primary Examiner* — Hung S Bui
(74) *Attorney, Agent, or Firm* — Staas & Halsey LLP

(57) ABSTRACT

An electronic device includes: a metal housing with an opening; a metal lid that is attached to the housing so as to cover the opening; a first substrate fixed in the housing and spread facing and parallel to the opening; two connectors that are fixed in the housing at a position facing and closer to the opening than the first substrate and are spread facing and parallel to the opening, the two connectors extending parallel to each other such that there is a predetermined space between the two connectors, the two connectors each being capable of receiving a second substrate that is inserted therein toward the space; and a metal plate member disposed in the space so that the metal plate member is fastened to the housing and resiliently contacts a surface of the first substrate, thereby electrically connecting a ground of the first substrate to the housing.

5 Claims, 26 Drawing Sheets

ELECTRONIC DEVICE AND METAL PLATE MEMBER

CROSS REFERENCE TO RELATED APPLICATIONS

This application claims the benefit under 35 U.S.C. Section 119 of Japanese Patent Application No. 2006-265961, filed Sep. 28, 2006, which is hereby incorporated by reference in it's entirety into this application.

BACKGROUND OF THE INVENTION

1. Field of the Invention

The present invention relates to an electronic device that has a substrate mounted with an electronic circuit and accommodated in a housing and to a metal plate member employed in the electronic device.

2. Description of the Related Art

Recently, various types of mobile personal computers (abbreviated as PC hereinafter) have come into widespread use. One such a PC is a so-called notebook PC composed of a main unit incorporating an arithmetic circuit and having a keyboard on the front surface thereof and a display unit having a display screen and being capable of folded onto the main unit. Another type of such a PC is a pure-tablet (slate) PC that incorporates an arithmetic circuit and has a display screen on the top surface thereof, to which a keyboard is optionally externally connected.

Such mobile PCs are made thinner to reduce the overall size and weight while maintaining the required display screen size. For further reduction in size and weight, a metal housing is often employed, which is also useful to provide an electromagnetic shield between the inside and the outside of the housing.

Additionally, a cable or the like used for connection to another device compromises the mobility of such mobile PCs, so that many mobile PCs incorporate radio communication features conforming to various standards, such as the wireless LAN and the Bluetooth (registered trademark). When a mobile PC incorporates radio communication features, it needs a reliable electromagnetic shield and a countermeasure for suppressing noise due to radio wave generated by an internal circuit.

For example, in Japanese Patent Laid-Open No. 2005-75301, there is proposed the device housed in a metal casing and having shot-range radio communication functions such as the Bluetooth that suppresses radio wave noise without compromising performance of transmitting and receiving radio waves.

Meanwhile, conventional measures against noise have needed certain space in a device for suppressing noise, which is becoming difficult due to the latest demand for a thinner and lighter device.

SUMMARY OF THE INVENTION

The present invention has been made in view of the above circumstances and provides an electronic device that utilizes a narrow space so as to realize measures against radio wave noise and a metal plate member employed in the electronic device.

An electronic device according to the present invention includes:

a metal housing with an opening;

a metal lid that is attached to the housing so as to cover the opening;

a first substrate that is fixed in the housing and is spread facing and parallel to the opening;

two connectors that are fixed in the housing at a position facing the opening and closer to the opening than the first substrate and that are spread facing and parallel to the opening, the two connectors extending parallel to each other such that there is a predetermined space between the two connectors, the two connectors each being capable of receiving a second substrate that is inserted therein toward the space from a side of the connector opposite to the space; and a metal plate member disposed in the space so that the metal plate member is fastened to the housing and is in resilient contact with a surface of the first substrate, thereby electrically connecting a ground of the first substrate to the housing.

In a typical notebook PC or pure-tablet PC, two connectors are placed on the main board which is the first substrate, so as to incorporate the sub substrate which is the second substrate such as a memory board for increasing memory capacity.

The electronic device according to the invention utilizes a dead space between the two connectors by placing the metal plate member in the space and fastening the metal plate member to the metal housing. This allows better use of a narrow space as well as suppression of radio wave noise by electrically connecting the ground of the first substrate to the metal housing.

Here, it is preferable that the metal plate member includes a base part and two resilient contact pieces, the base part being disposed in the space such that the base part is spread parallel to the two connectors and both ends of the base part is fastened to the housing, the two resilient contact pieces being spread from the respective ends of the base part toward a substantial center of the base part while facing the first substrate so that tips of the resilient contact pieces contact the first substrate.

As described above, the metal plate member is composed of the base part and the two resilient contact pieces. Provision of the base part securely fastens the metal plate member to the housing with the ends of the metal plate member fastened to the housing. Additionally, the two resilient contact pieces make the ground of the first substrate to be electrically connected to the housing at a position near the ends of the base part fastened to the housing.

Here, it is preferable that the second substrate is typically a memory board mounted with a memory. More preferably, the housing is made of a magnesium alloy for making the device thinner and lighter while maintaining strength.

Further, the electronic device according to the invention may be typically a mobile computer, a so-called pure-tablet (slate-type PC) PC, having a tabular form as a whole that houses in the housing an electronic circuit for data processing and has a display screen fixed to a surface of the computer.

The present invention can be preferably employed to the so-called pure-tablet (slate) PC for which the demand for a thinner device is often made and on which internal components are closely mounted.

Additionally, the metal plate member in the electronic device according to the present invention can realize features described above.

As described above, the electronic device according to the present invention is capable of reducing radio wave noise effectively by better utilizing a narrow space.

Figure 12:
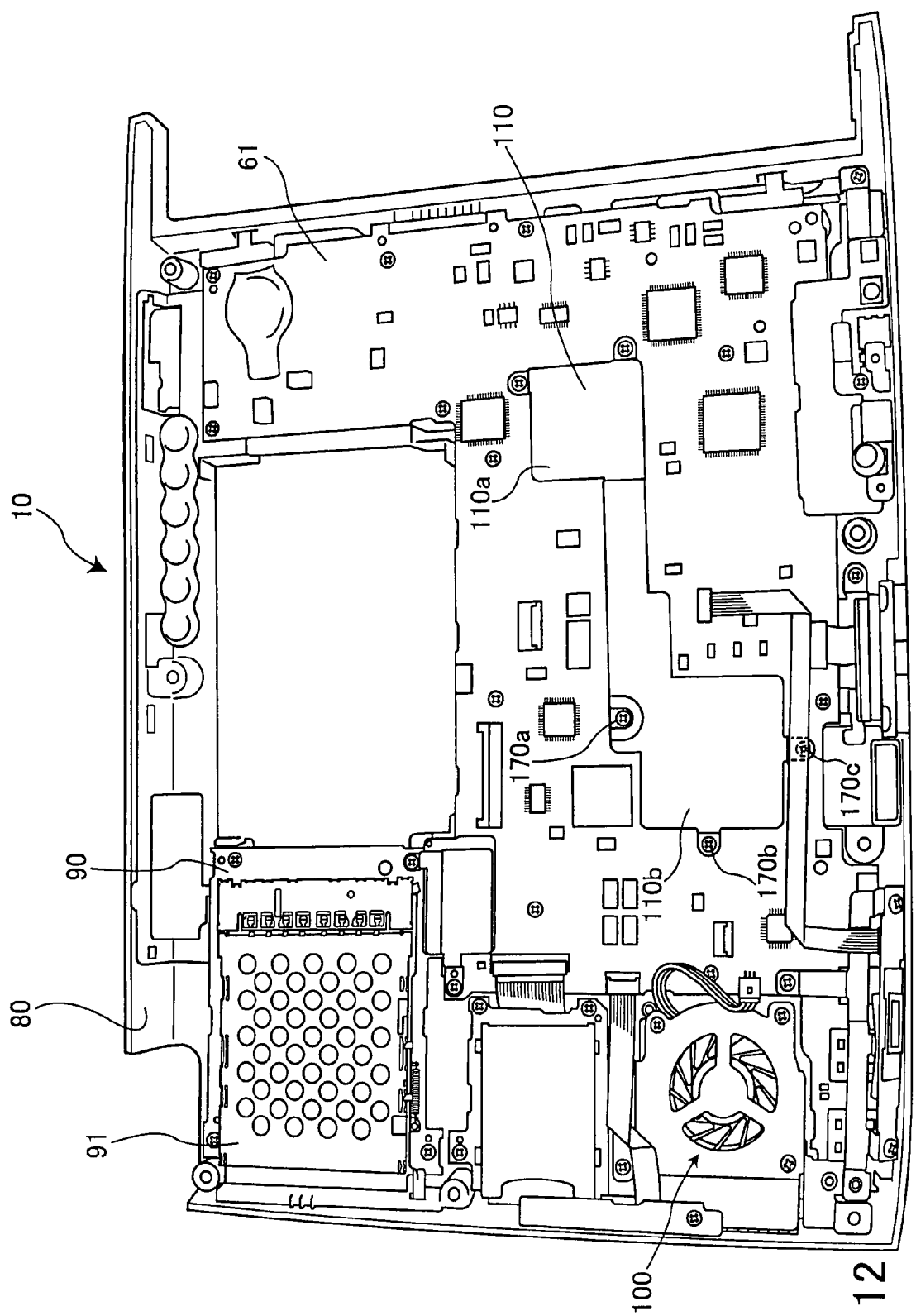
FIG. 12 shows the inside of a housing, with an image display panel being removed from the top surface of the slate PC shown in FIG. 1.
Figure 21:
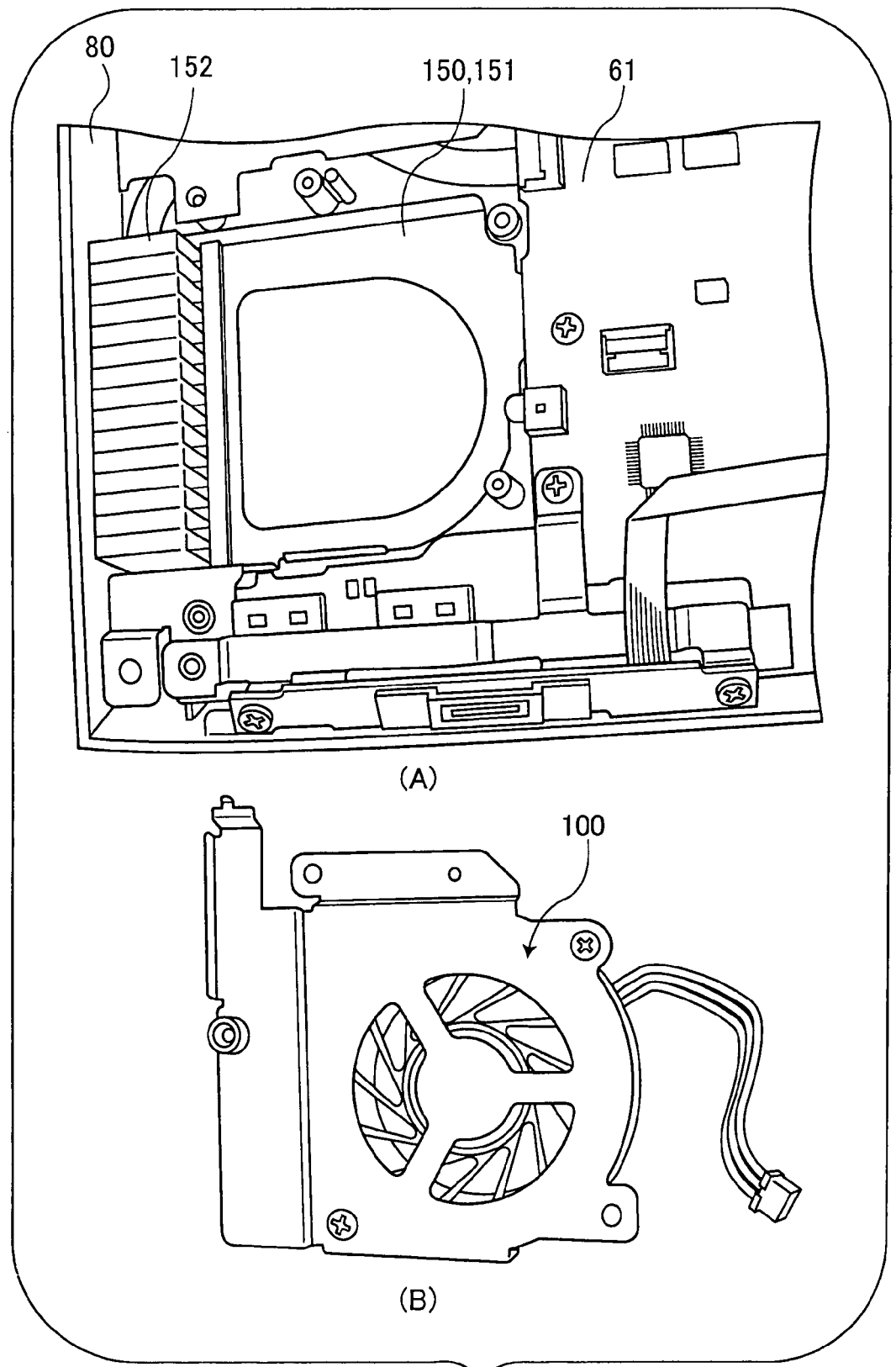
Figure 22:
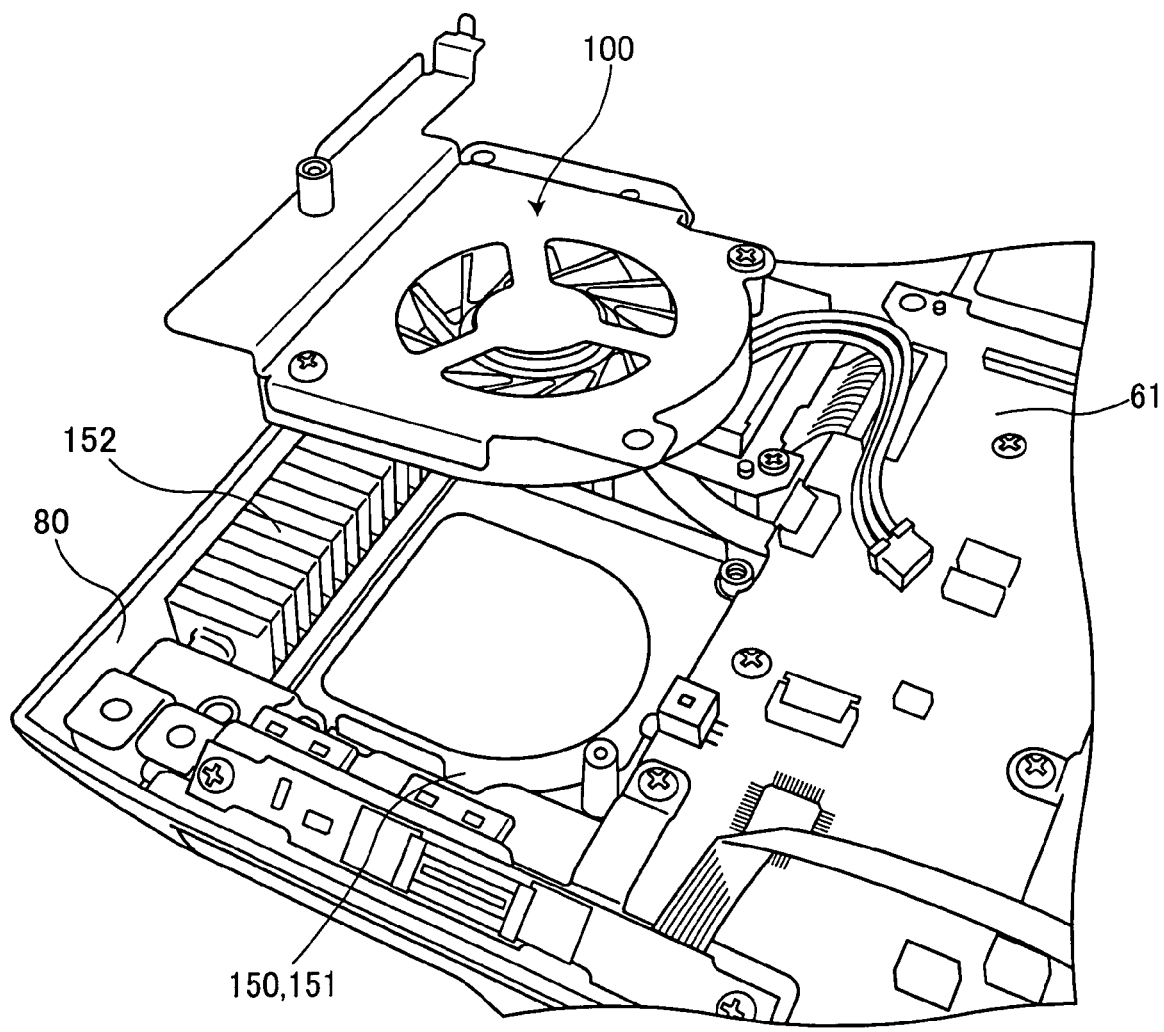
Figure 23:
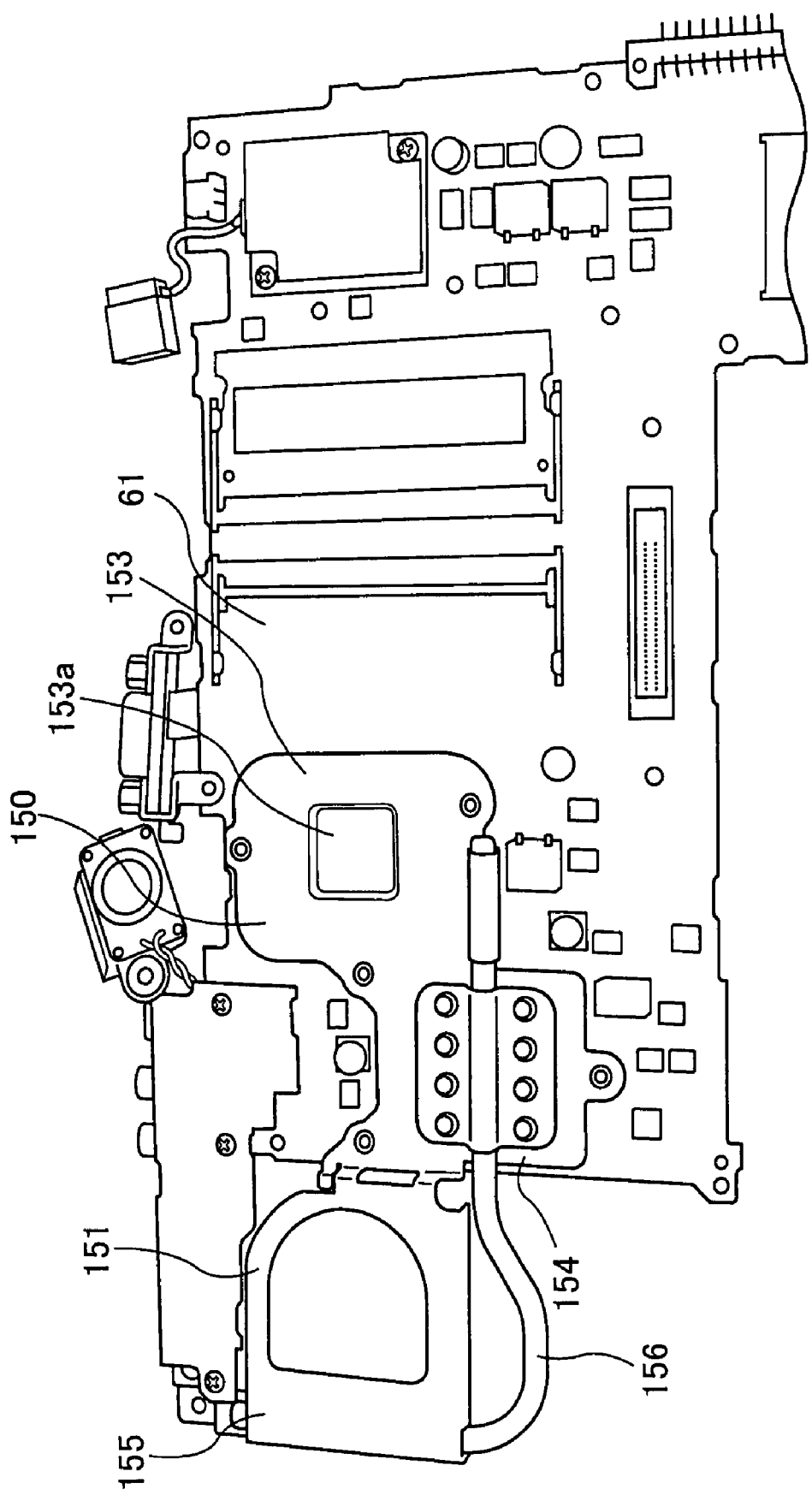
Figure 24:
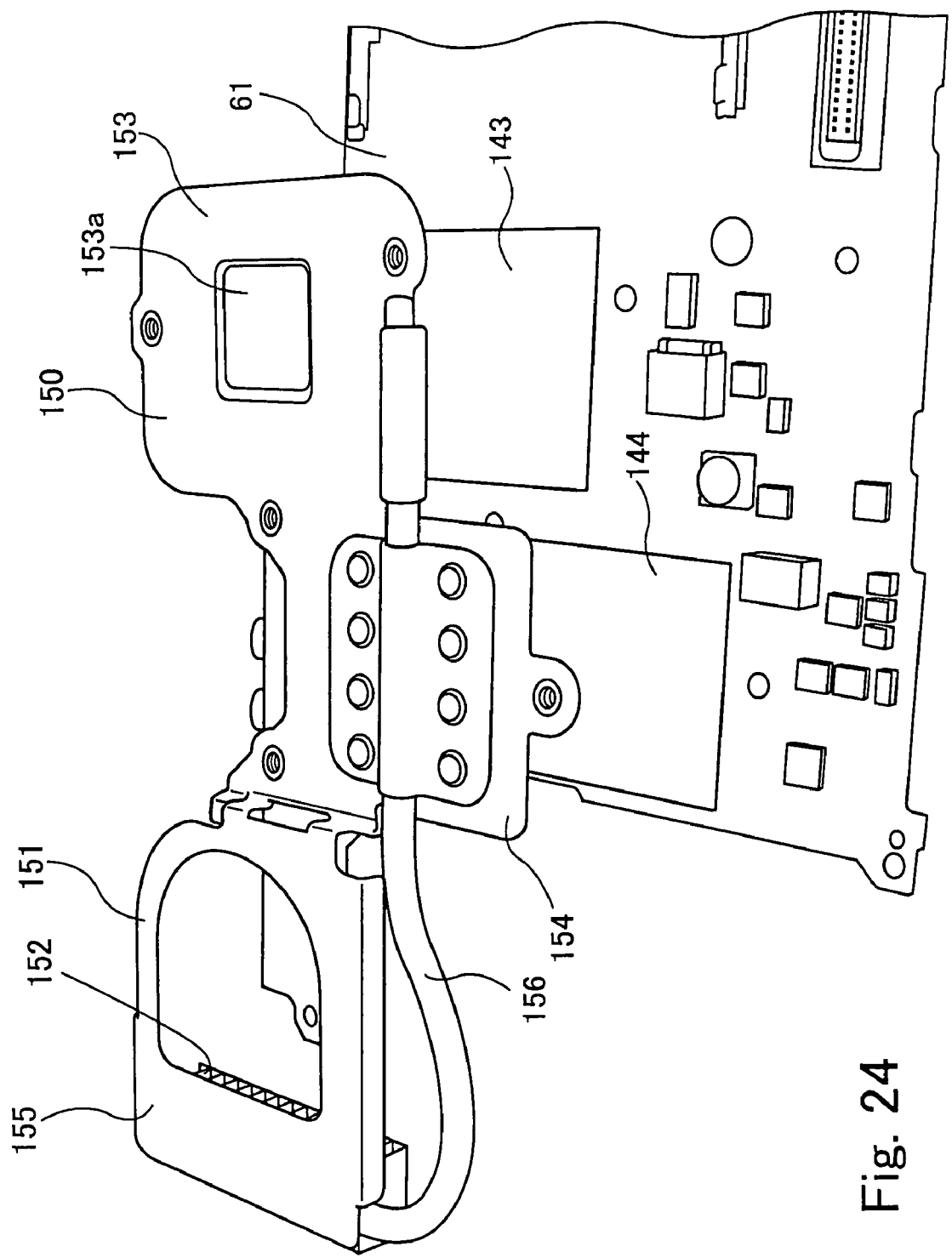
Figure 25:
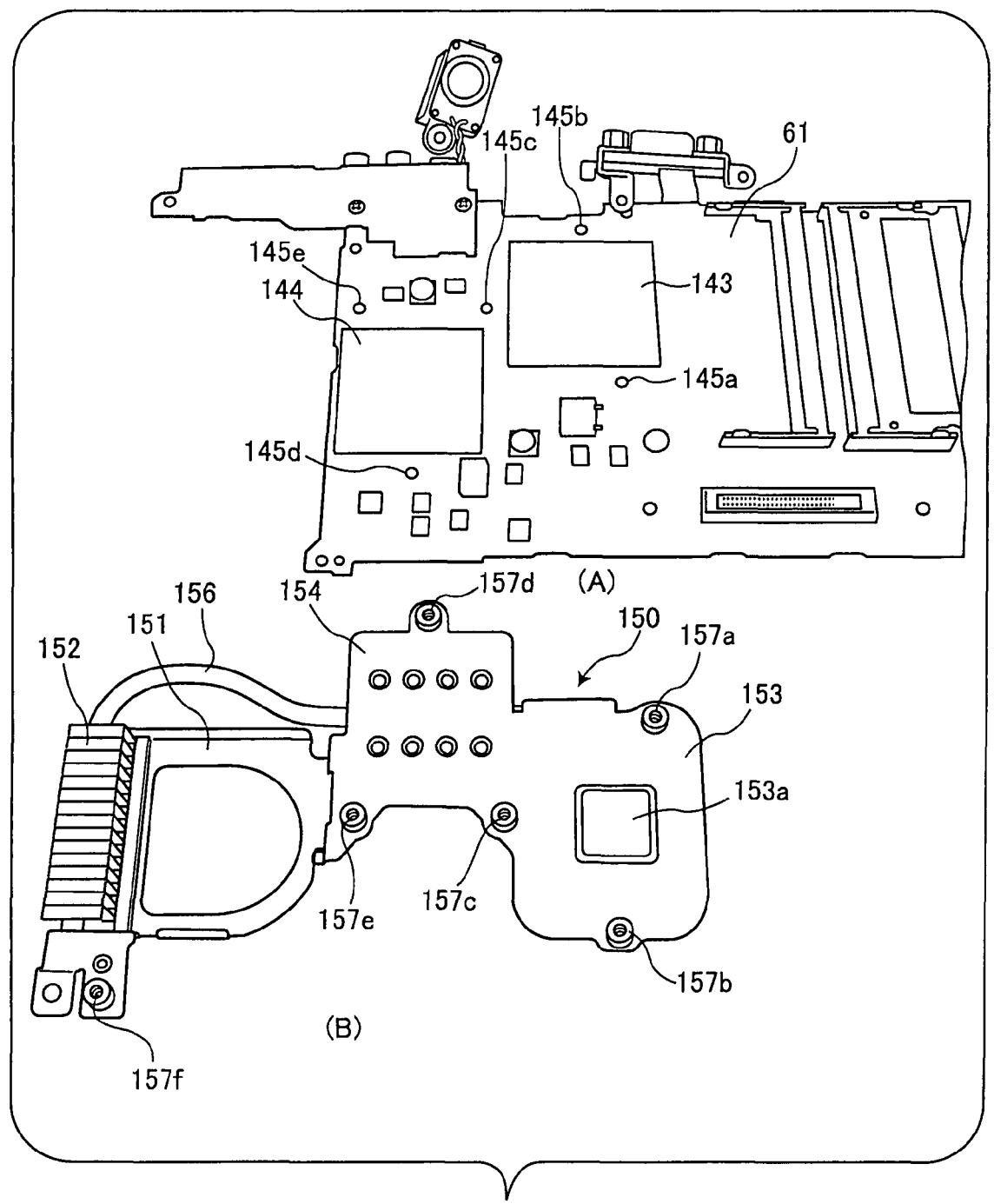
Figure 26:
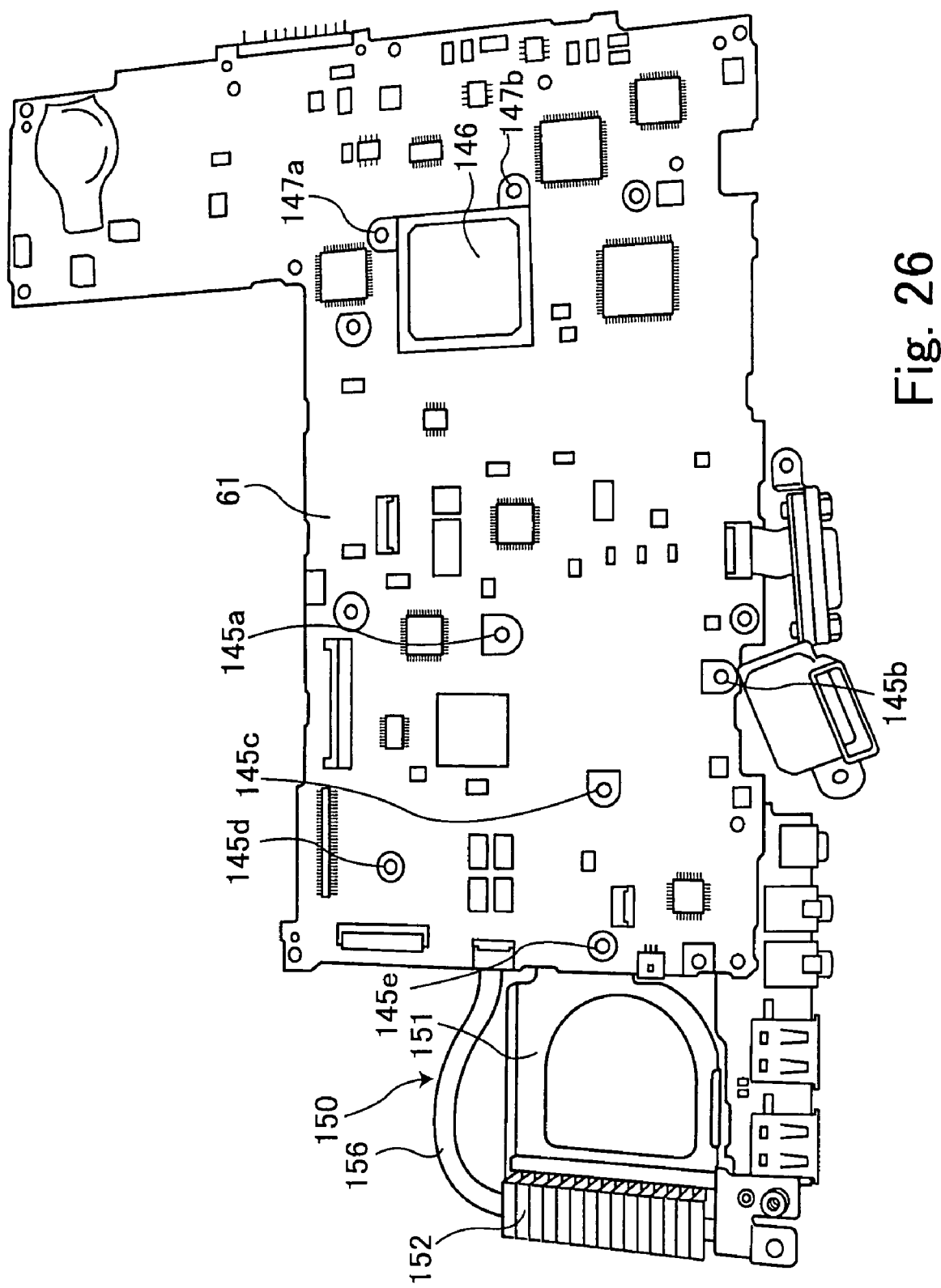

Part (A) of FIG. 21 shows the interior of the housing after the cooling fan is removed;

Part (B) of FIG. 21 shows the cooling fan removed from the housing;

FIG. 22 is an exploded perspective view of the interior of the housing after the cooling fan is removed and the cooling fan removed from the housing;

FIG. 23 shows the main substrate with a heat radiator component mounted thereon, removed from the housing, with the surface facing the bottom of the housing facing upward;

FIG. 24 is an exploded perspective view showing the same surface of the main substrate as shown in FIG. 23 and the heat radiator component after the heat radiator component is removed from the main substrate;

Part (A) of FIG. 25 shows the same surface of the main substrate as shown in FIGS. 23 and 24 after the heat radiator component is removed;

Part (B) of FIG. 25 shows the surface of the heat radiator component intended to come into contact with the main substrate; and FIG. 26 shows the upper surface, which is the same surface as shown in FIG. 12, of the main substrate removed from the housing.

DETAILED DESCRIPTION OF THE INVENTION

In the following, an embodiment of the present invention will be described.

[Overall Configuration]

Figure 1:
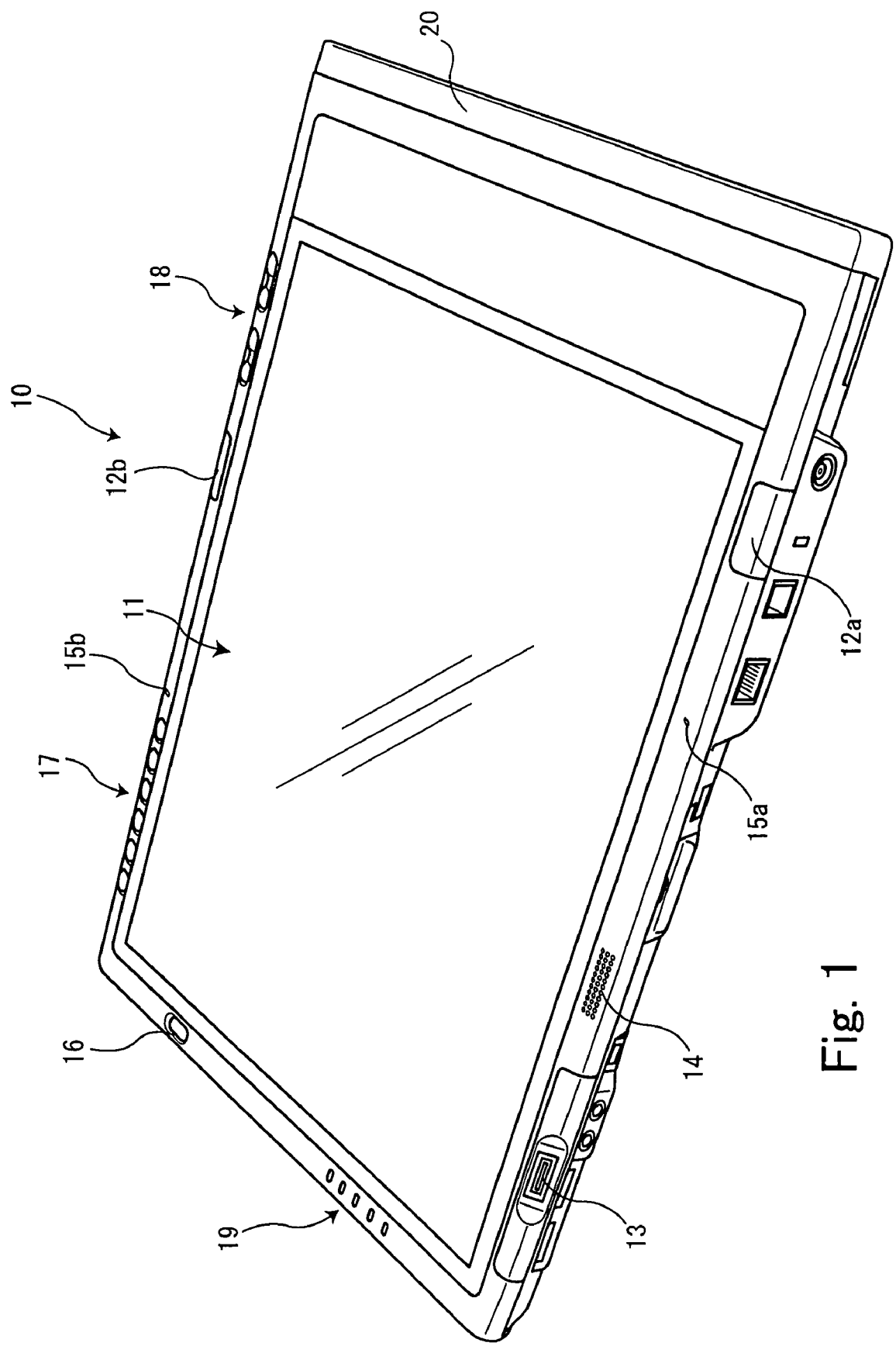
FIG. 1 is a perspective view of a slate PC, which is an electronic device according to an embodiment of the present invention, seen from the top surface having a display screen formed thereon.
Figure 2:
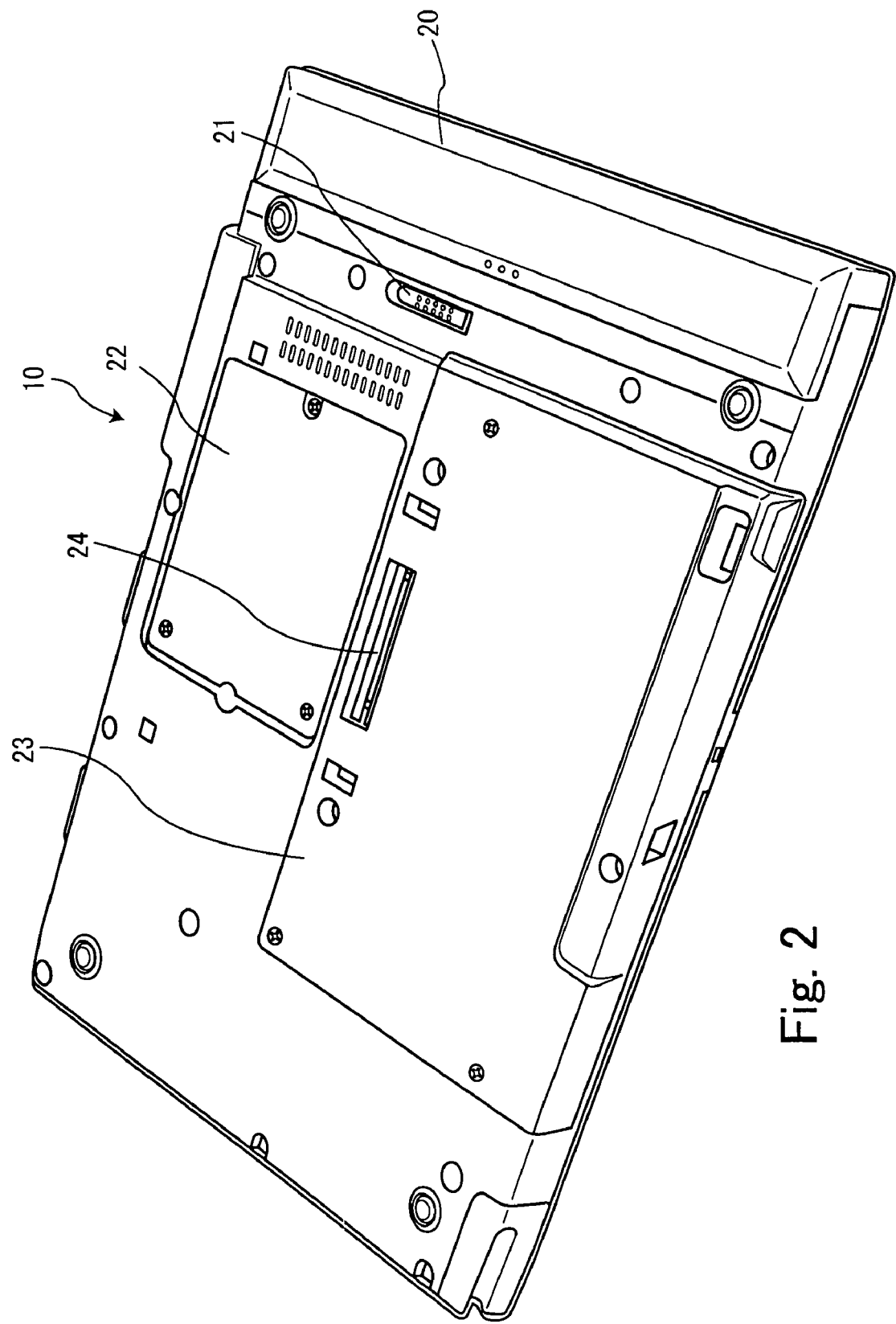
FIG. 2 is a perspective view of the slate PC shown in FIG. 1 seen from the bottom surface.

FIG. 1 is a perspective view of a slate PC, which is an electronic device according to an embodiment of the present invention, seen from the top surface having a display screen formed thereon. FIG. 2 is a perspective view of the slate PC shown in FIG. 1 seen from the bottom surface.

A slate PC 10 has a housing made of a magnesium alloy that forms the bottom surface and the side surfaces of the slate PC 10 and an image display panel that has a display screen for displaying images and covers the front of the housing with the display screen facing outwardly. The housing and the image display panel form the exterior of the slate PC 10.

On the front surface of the slate PC 10, the image display panel is disposed with a display screen 11 facing outwardly. Two infrared communication windows 12a and 12b and a fingerprint sensor 13 are arranged around the image display panel.

The infrared communication windows 12a and 12b are intended for infrared communication with a keyboard (not shown) separate from the slate PC 10, for example, and receive keyboard manipulation information by infrared communication. The fingerprint sensor 13 is intended for authentication and can be configured so that the slate PC 10 can be operated only when the fingerprint detected by the fingerprint sensor 13 matches with the fingerprint of an authenticated user.

In addition, a speaker opening 14, two microphone openings 15a and 15b, a power supply button 16, various push buttons 17 and 18 and various indicators 19 are disposed along the circumference of the top surface of the slate PC 10, and a part of a battery pack 20 can be seen on the top surface of the slate PC 10.

In addition, as shown in FIG. 2, the slate PC 10 has, on the bottom surface thereof, a battery pack 20, an unlock element 21 for removing the battery pack, a lid 22 that is opened when mounting a memory board in the slate PC 10, a lid 23 that is opened when mounting or removing a hard disk, a Bluetooth module and a wireless LAN module in the slate PC 10, a connector 24 to connect to a port replicator (not shown) and the like. Here, the lid 22 is made of an aluminum alloy, and the lid 23 is made of plastic whose inner surface is plated. These lids serve to electromagnetically shield the interior in cooperation with the housing made of a magnesium alloy that forms the bottom surface and the side surfaces of the slate PC 10. The arrangement inside the lid 22 and the arrangement inside the lid 23 will be described later.

Figure 3:
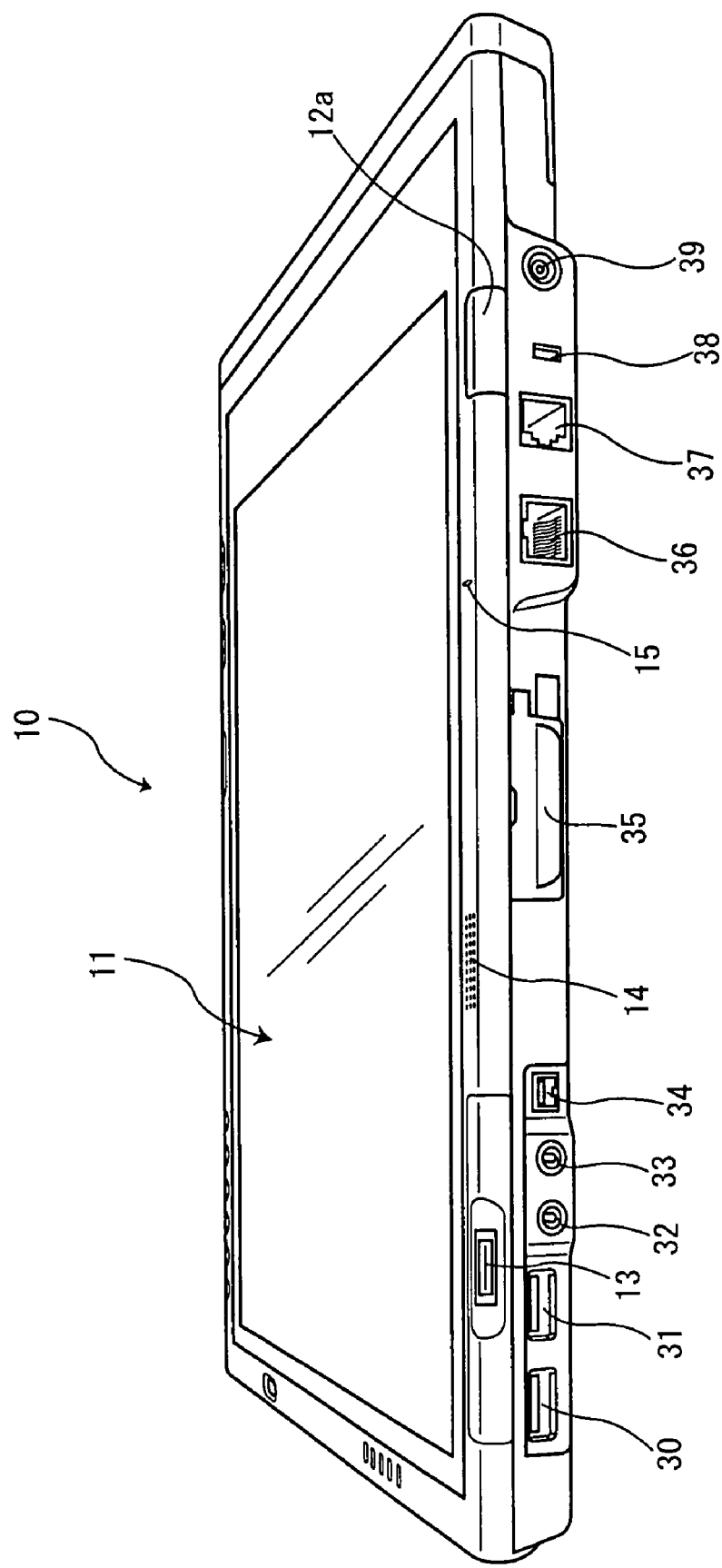
FIG. 3 is a schematic view of the slate PC 10 shown in FIG. 1, seen from the front side.

FIG. 3 is a schematic view of the slate PC 10 shown in FIG. 1, seen from the front side.

From left to right in FIG. 3, the slate PC 10 has, on this side, two USB connector ports 30 and 31, a headphone connector port 32, a microphone connector port 33, an IEEE 1394 connector port 34, a VGA connector housing section 35, a LAN connector port 36, a MODEM connector port 37, a security lock hole 38, and a DC power supply connector port 39.

Figure 4:
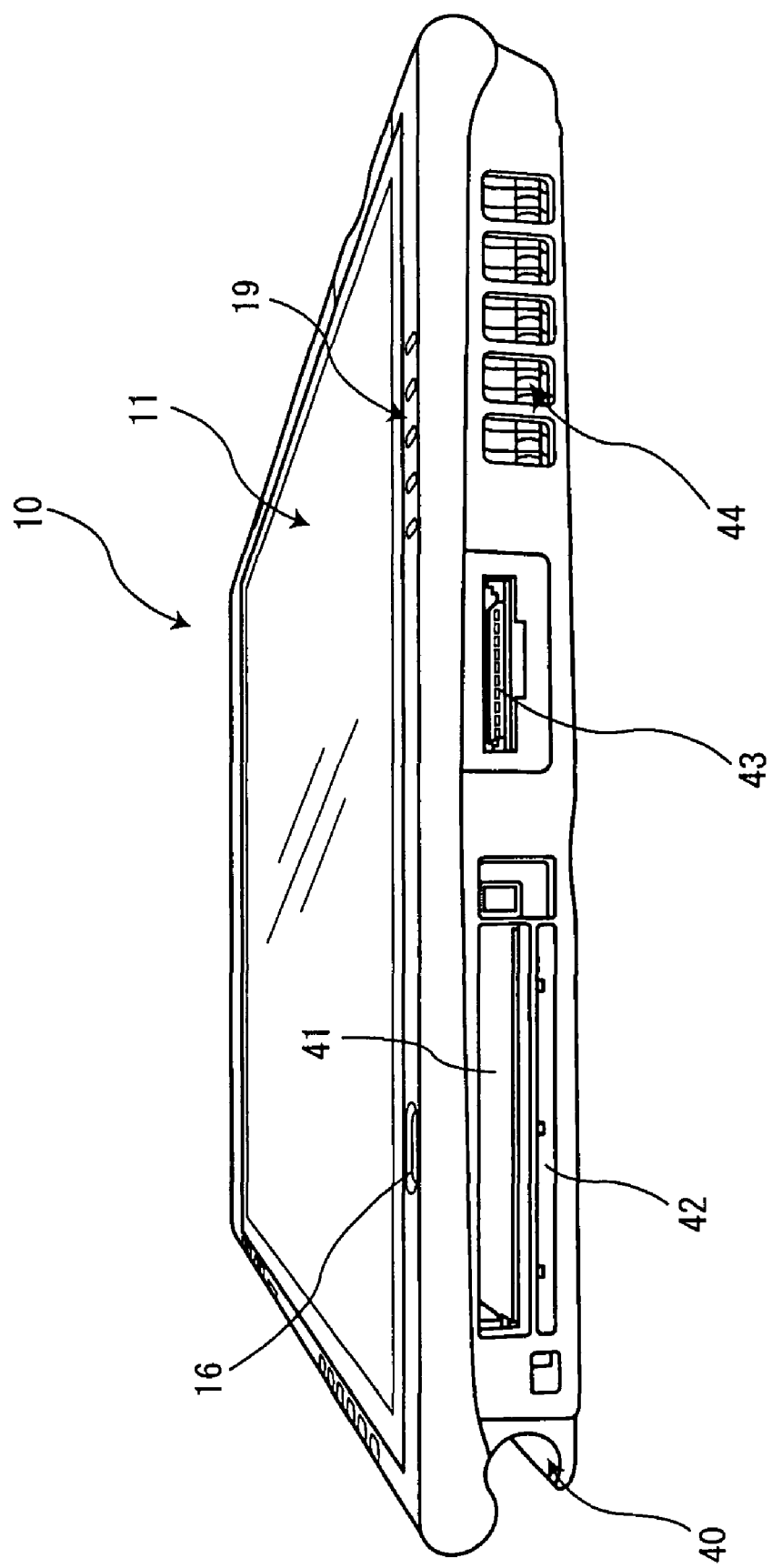
FIG. 4 is a schematic view of the slate PC 10 shown in FIG. 1, seen from the left side.

FIG. 4 is a schematic view of the slate PC 10 shown in FIG. 1, seen from the left side. From left to right in FIG. 4, a pen housing opening 40, a PC card insertion port 41, a smart card insertion port 42, a medium insertion port 43 configured to removably receive plural kinds of media, and an air exhaust port 44 for air cooling of the interior are arranged on this side. Here, the pen (not shown) is an input device that inputs, by touching the display screen 11 (see FIG. 1), an instruction corresponding to an icon or the like displayed at the point that the pen touches.

Figure 5:
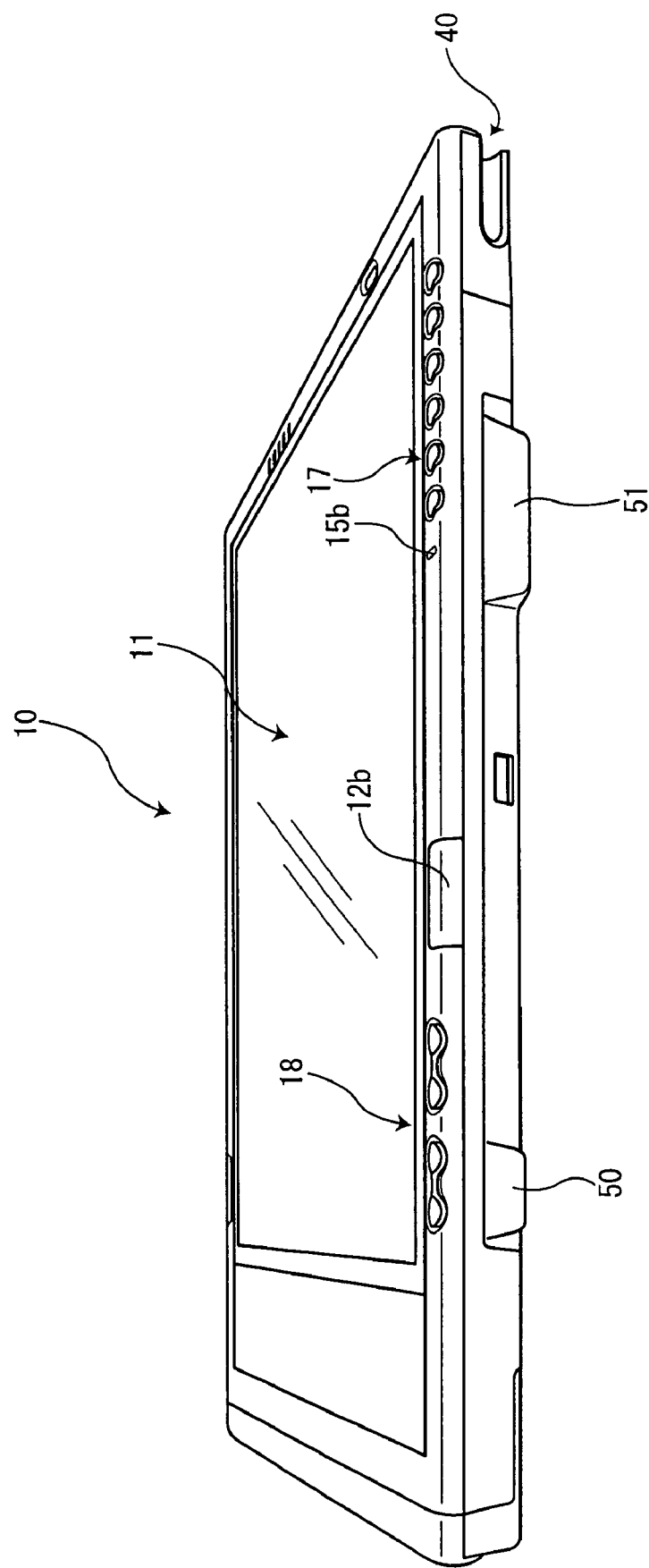
FIG. 5 is a schematic view of the slate PC 10 shown in FIG. 1, seen from the rear side.

FIG. 5 is a schematic view of the slate PC 10 shown in FIG. 1, seen from the rear side.

On this side, a wireless LAN antenna housing section 50 and a Bluetooth antenna housing section 51 are provided.

Figure 6:
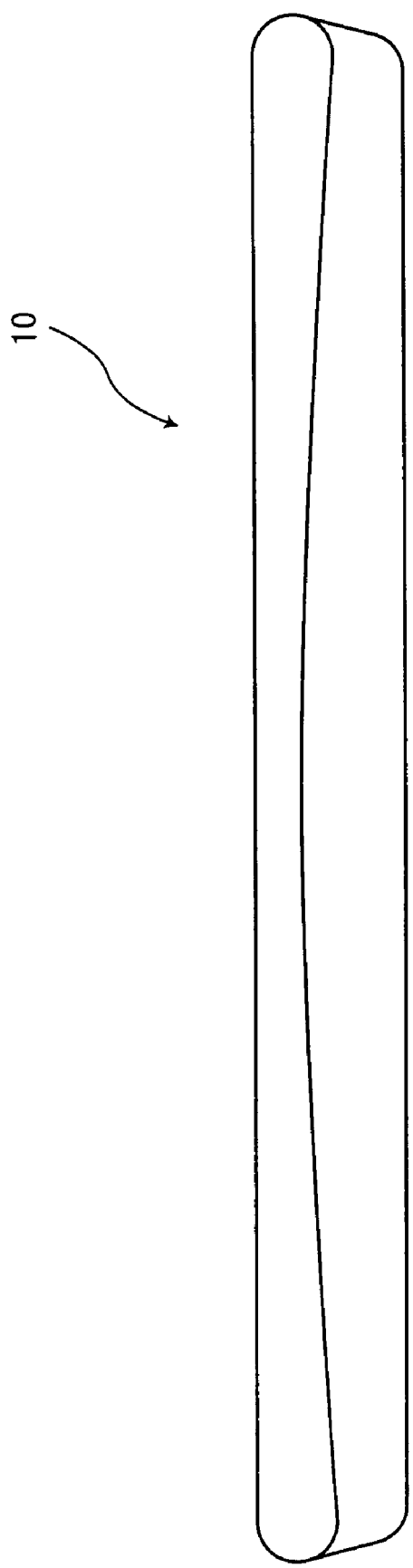
FIG. 6 is a schematic view of the slate PC 10 shown in FIG. 1, seen from the right side.

FIG. 6 is a schematic view of the slate PC 10 shown in FIG. 1, seen from the right side.

This drawing shows the side of the slate PC 10 with the battery pack 20 shown in FIGS. 1 and 2 mounted thereon.

Since the battery pack 20 is attached to this side, any other features are not provided on this side.

[Arrangement Inside Lid]

Figure 7:
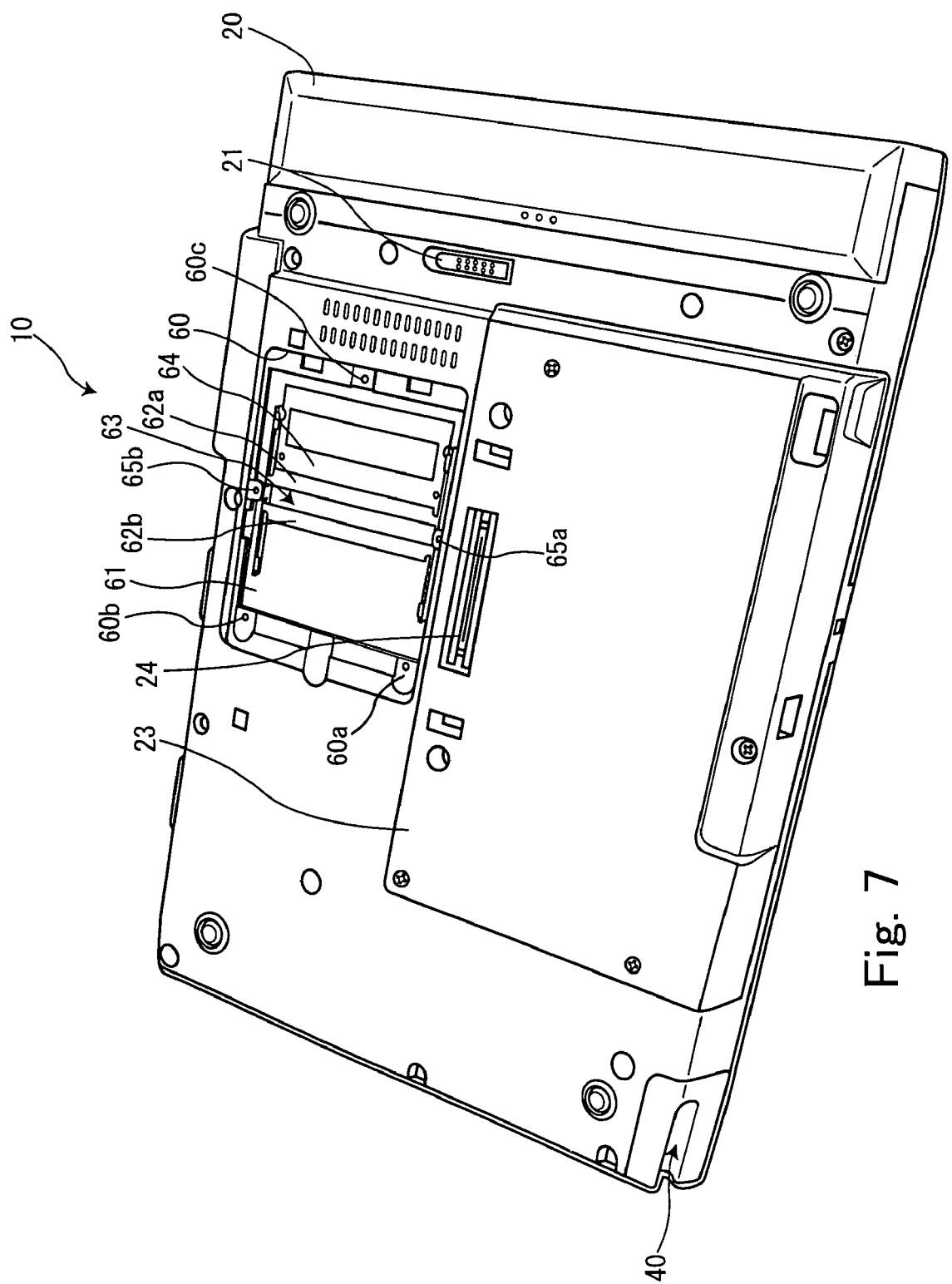
FIG. 7 shows the bottom surface of the slate PC shown in FIG. 1.

FIG. 7 shows the bottom surface of the slate PC 10. In FIG. 7, the lid 22 shown in FIG. 2 is omitted, and the inside of the opening that would otherwise be covered with the lid 22 can be seen.

Figure 8:
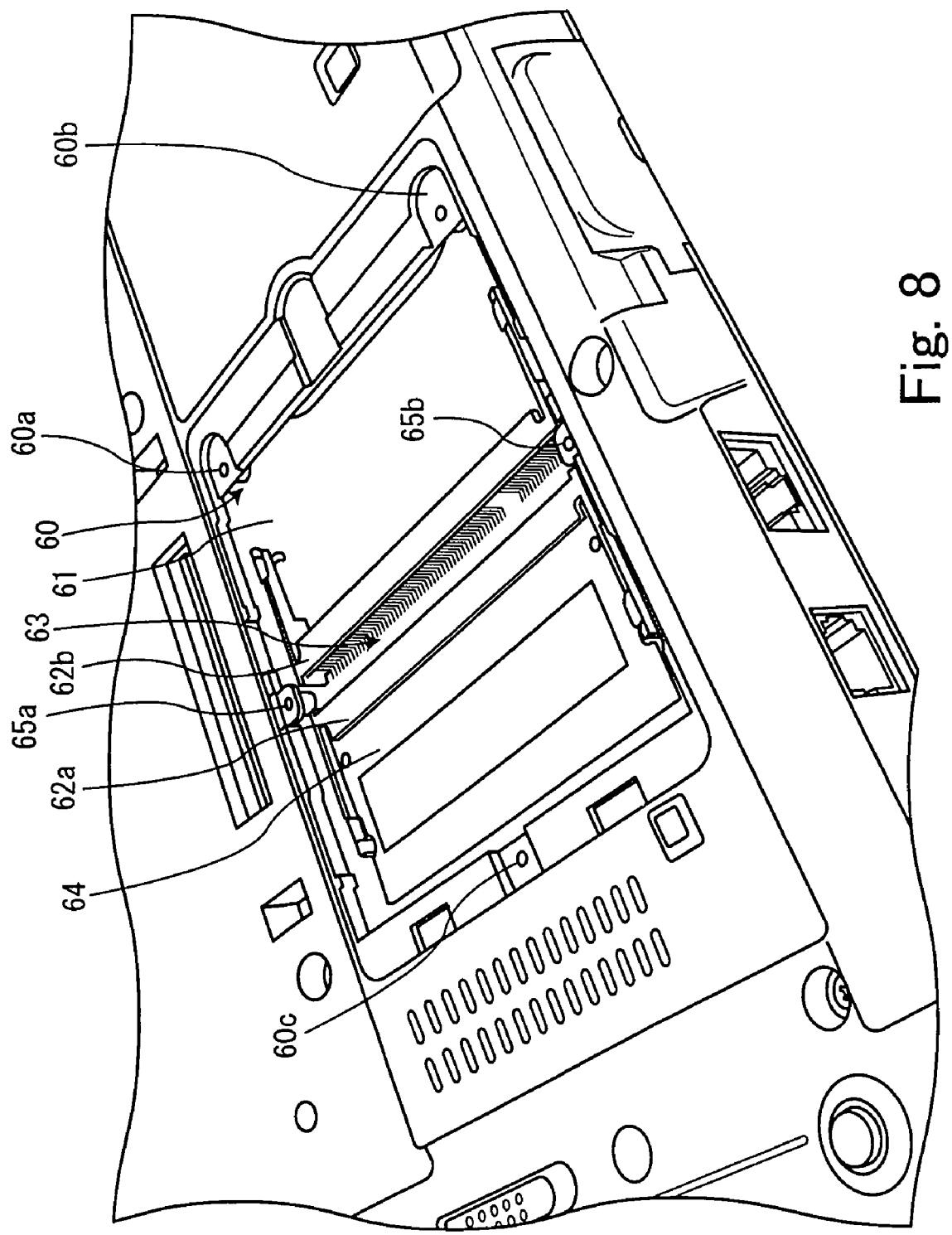
FIG. 8 is an enlarged perspective view of the inside of an opening shown in FIG. 7.

FIG. 8 is an enlarged perspective view of the inside of the opening shown in FIG. 7.

In FIGS. 7 and 8, a metal plate member 70 (see FIGS. 9 through 11) described later is also omitted.

As described above, the bottom surface and the side surfaces of the slate PC 10 are covered by the housing made of a magnesium alloy, openings formed in the bottom surface of the housing are covered with the lids 22 and 23 made of an aluminum alloy (see FIG. 2), and the lids 22 and 23 are screwed to the housing. Thus, the lids 22 and 23 are electrically connected to the housing, thereby forming a rigid electromagnetic shield.

An opening 60 shown in FIGS. 7 and 8 is one of the openings formed in the bottom surface of the housing. If the lid 22 shown in FIG. 2 is screwed to the housing at three threaded parts 60a, 60b and 60c the opening 60 is closed. If the three screws are removed, the inside of the opening 60 can be exposed as shown in FIGS. 7 and 8.

A main substrate 61 facing the opening 60 and extending parallel to the opening 60 on which a CPU (not shown) that performs arithmetic processings is mounted is fixed in the housing. On the surface of the main substrate 61 facing the opening 60, two connectors 62a and 62b are mounted in the approximate middle of the area that can be seen in the opening 60. The two connectors 62a and 62b are arranged on a plane parallel to the opening 60 and extend parallel to each other with a space 63 formed therebetween. A memory board on which a memory is mounted is inserted into the connectors 62a and 62b from the side opposite to the space 63 (toward the space 63) in a position parallel to the main substrate 61.

FIGS. 7 and 8 show only one memory board 64 inserted into one of the two connectors 62a and 62b, specifically, the connector 62a. To increase the memory capacity, another memory board can be inserted into the remaining connector, or the memory board currently inserted in the connector can be replaced with a memory board on which a memory with a higher capacity is mounted.

In addition, threaded parts 65a and 65b, which are protruding parts of the housing, are formed at opposite ends of the space 63. A metal plate member 70 described below is screwed to the threaded parts 65a and 65b.

Figure 9:
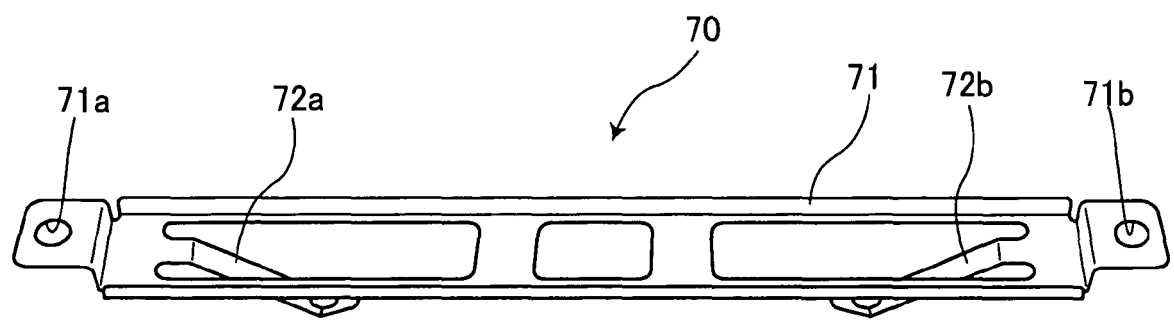
FIG. 9 is a perspective view of a metal plate member.
Figure 10:
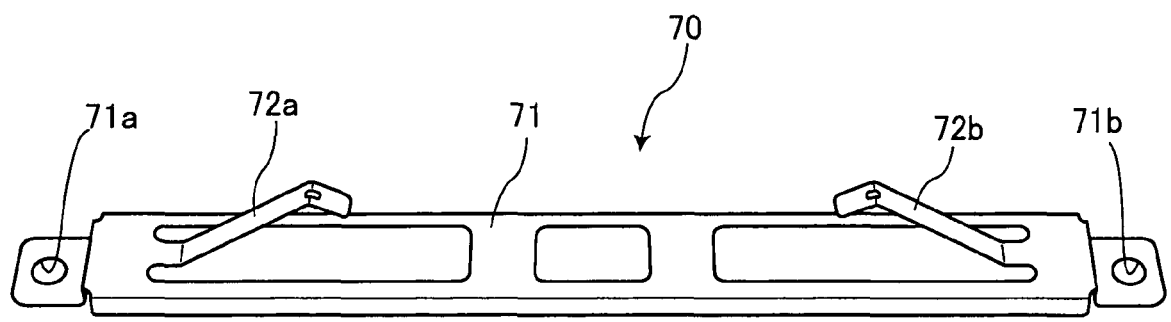
FIG. 10 is a perspective view of the metal plate member in FIG. 9 shown upside down.

FIG. 9 is a perspective view of the metal plate member 70, and FIG. 10 is a perspective view of the metal plate member 70 in FIG. 9 shown upside down.

Figure 11:
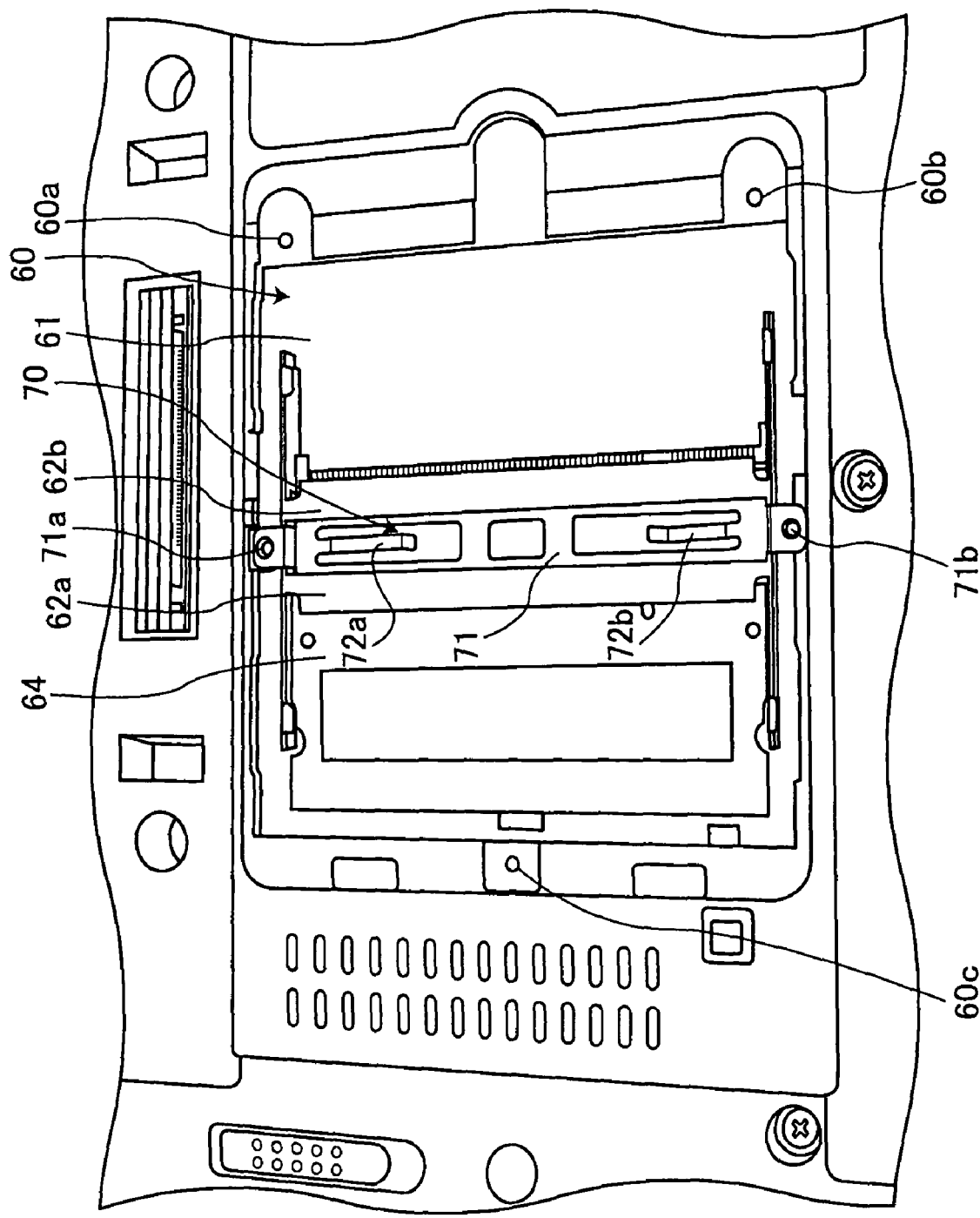
FIG. 11 shows the metal plate member placed in the opening.

FIG. 11 shows the metal plate member placed in the opening.

The metal plate member 70 has a base part 71 having screw holes 71a and 71b formed at the opposite ends thereof, and two resilient contact pieces 72a and 72b formed by bending parts of the base part 71. When the metal plate member 70 is mounted in the opening 60 (FIGS. 7 and 8), the base part 71 is placed in the space 63 in the opening, extends parallel to the two connectors 62a and 62b and is screwed, at the opposite ends having the screw holes 71a and 71b, to the threaded parts 65a and 65b (FIGS. 7 and 8) of the housing.

The two resilient contact pieces 72a and 72b extend from the opposite ends of the base part 71 toward the approximate center thereof and to the main substrate 61 (FIGS. 7 and 8) so that the tips thereof come into resilient contact with the main substrate 61. A ground pattern is formed on the main substrate 61 at areas with which the resilient contact pieces 72a and 72b come into contact. If the metal plate member 70 is mounted, the ground on the main substrate 61 and the housing made of a metal (a magnesium alloy) are electrically connected to each other. Thus, such a narrow space can be effectively used to effectively reduce the radio noise.

[Arrangement for Mounting or Removing Component]

FIG. 12 shows the inside of the housing, with the image display panel being removed from the top surface of the slate PC shown in FIGS. 1 and 2.

The slate PC 10 has a housing 80 made of a magnesium alloy that forms the bottom surface and the side surfaces of the slate PC 10, and various components are arranged in the housing 80.

Of the components, those that will be involved in the following description include the main substrate 61 on which the CPU (not shown) that performs arithmetic processings or the like is mounted, a sub substrate 90 on which a PC card slot 91 into which a PC card is inserted or the like is mounted, and a cooling fan 100 for air cooling. In addition, a heat transfer plate 110 is screwed to the surface of the main substrate 61 that can be seen in FIG. 12. The heat transfer plate 110 will be described later.

Figure 13:
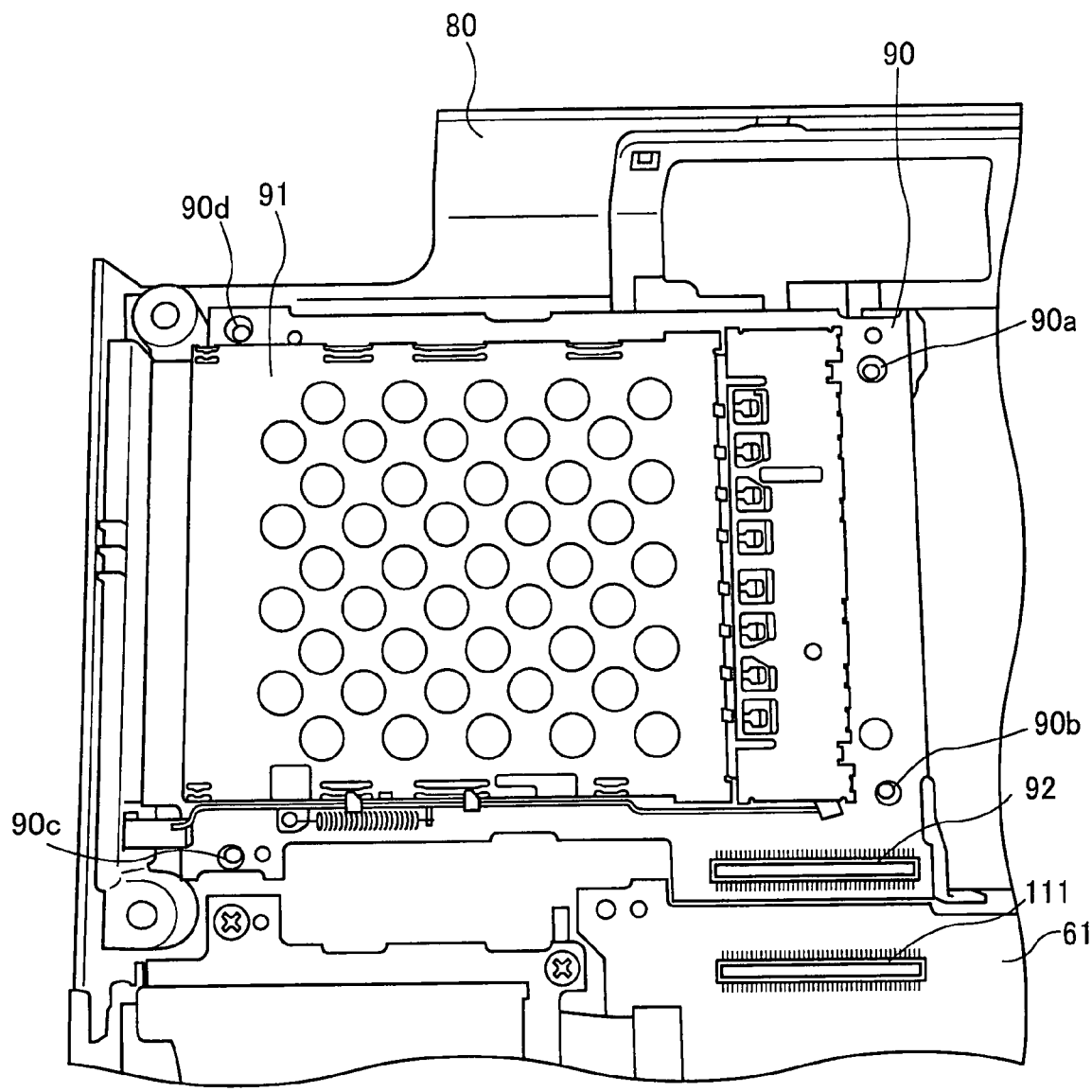
FIG. 13 is an enlarged view of a sub substrate disposed in the housing.

FIG. 13 is an enlarged view of the sub substrate 90 disposed in the housing 80. In FIG. 13, screws for securing the sub substrate 90 to the housing and components (i.e. a flexible substrate and a keep plate described later) for coupling the sub substrate 90 and the main substrate 61 with each other are omitted. The sub substrate 90 has four screw holes 90a, 90b, 90c and 90d and is secured to the housing 80 by screws inserted into the screw holes 90a, 90b, 90c and 90d. One of the screws inserted into the screw holes 90a, 90b, 90c and 90d, specifically, the screw inserted into the screw hole 90b is used also to secure the keep plate described later.

The sub substrate 90 and the main substrate 61 are fixed at different heights in the housing 80. This is intended to make the slate PC 10 thinner by reducing the dead space in the direction along the thickness of the slate PC 10 produced by the difference in thickness between the components mounted on the sub substrate 90 and the main substrate 61. The sub substrate 90 and the main substrate 61 fixed in the housing 80 are adjacent to each other at respective border areas. In the border areas, a pair of connectors 92 and 111 for interconnecting the sub substrate 90 and the main substrate 61 are provided.

Figure 14:
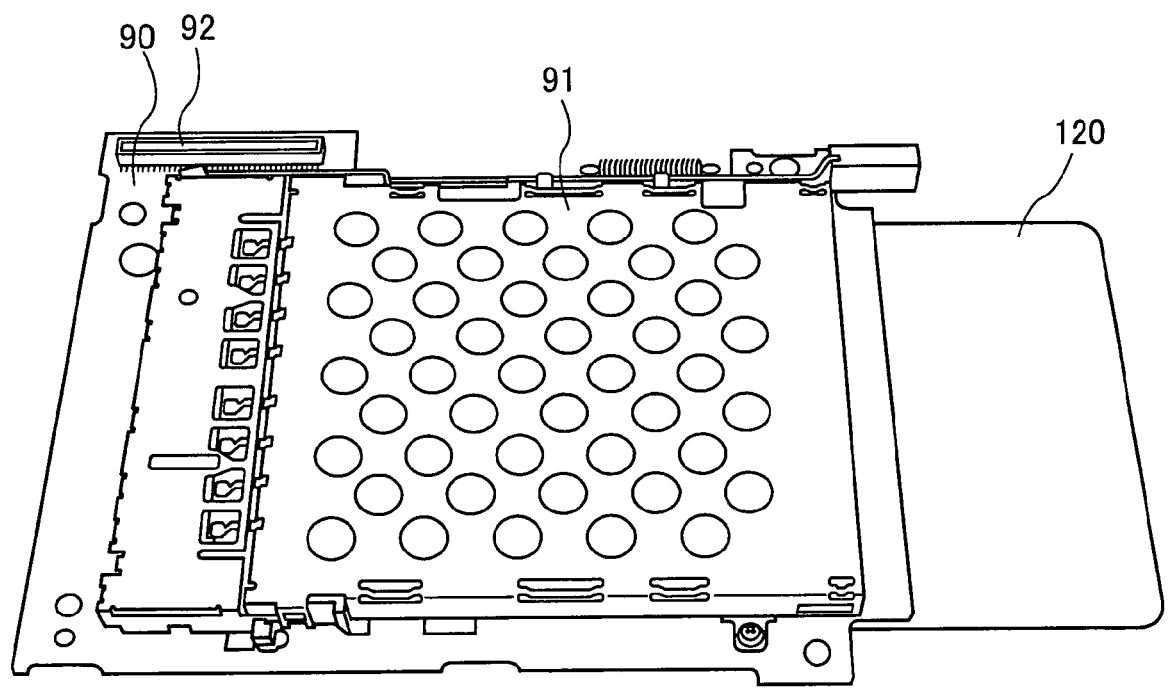
FIG. 14 is a perspective view of the sub substrate removed from the housing.
Figure 15:
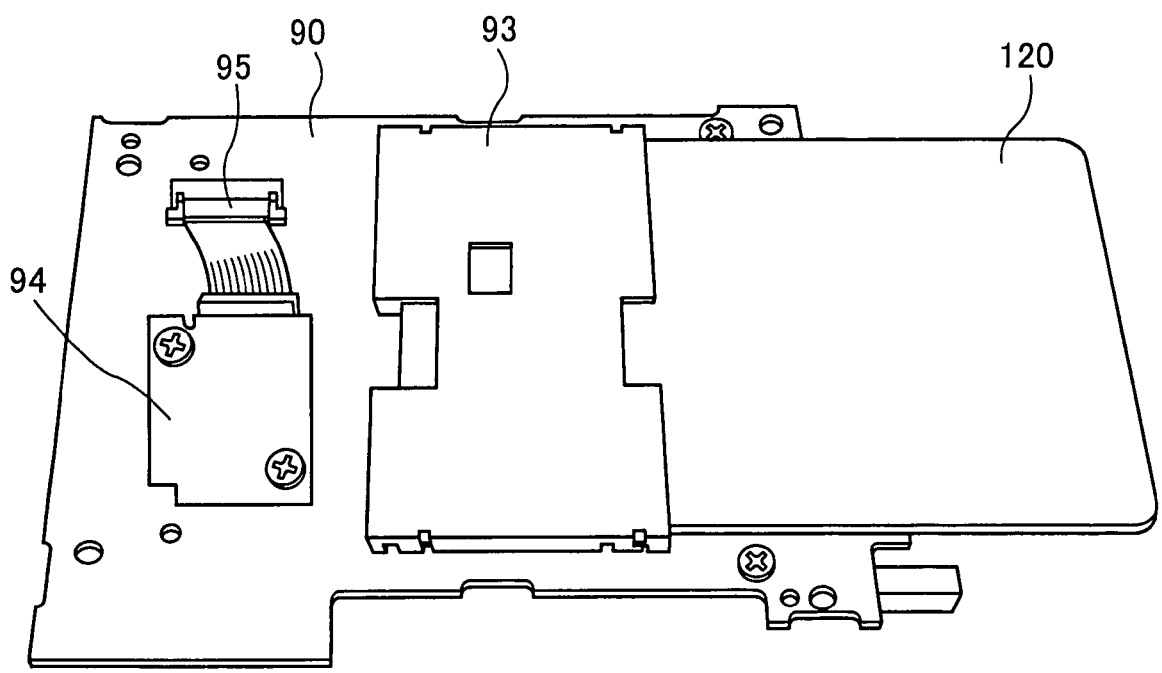
FIG. 15 is a perspective view showing the bottom of the sub substrate.

FIG. 14 is a perspective view of the sub substrate removed from the housing, and FIG. 15 is a perspective view showing the bottom of the sub substrate. In FIGS. 14 and 15, a smart card 120 is mounted.

On one surface of the sub substrate 90, there is mounted the PC card slot 91 into which the PC card (not shown) is inserted through the PC card insertion port 41 shown in FIG. 4 for access. On the other surface of the sub substrate 90, there is mounted a smart card slot 93 into which the smart card 120 is inserted through the smart card insertion port 42 shown in FIG. 4 for access. The smart card slot 93 has a smaller footprint on the sub substrate 90 than the PC card slot 91, and therefore, a Bluetooth module 94 for enabling radio communication conforming to the Bluetooth standard is additionally mounted on the same surface as the smart card slot 93. The Bluetooth module 94 is screwed to the sub substrate 90 and connected to the sub substrate 90 via a connector 95 and can be easily removed from the sub substrate 90.

Figure 16:
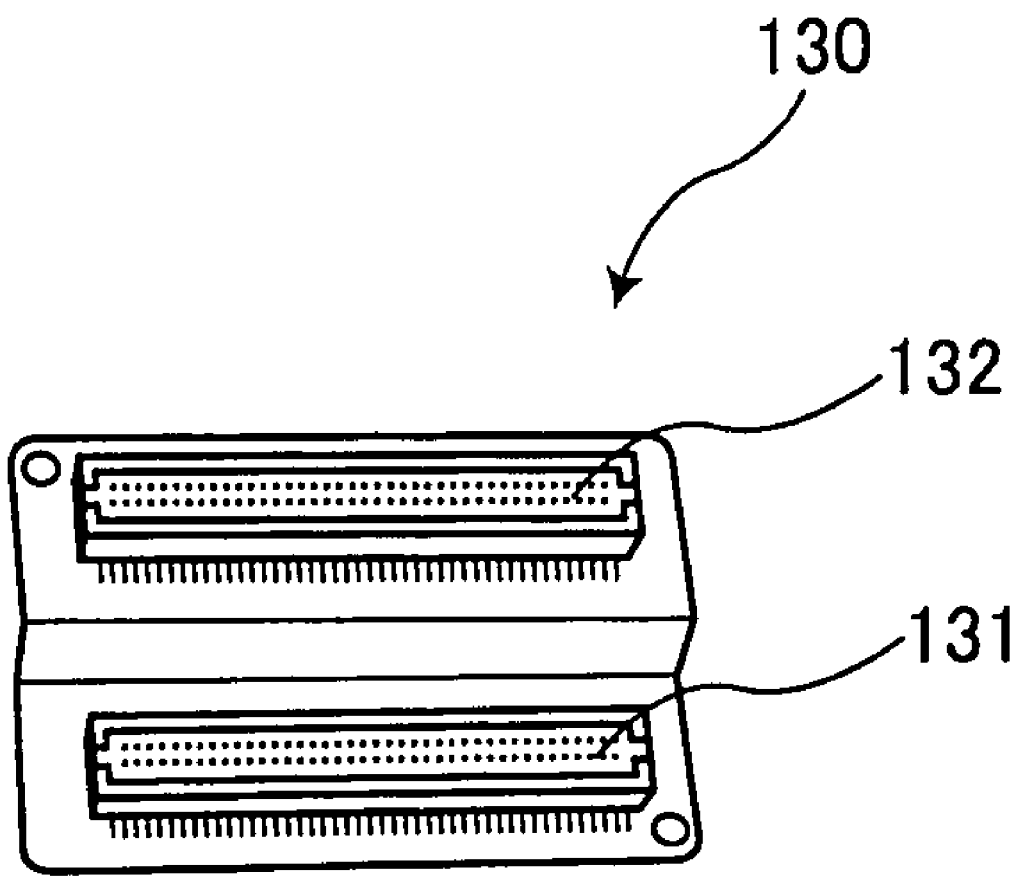
FIG. 16 shows a flexible substrate for connecting the sub substrate and a main substrate to each other.

FIG. 16 shows a flexible substrate 130 for connecting the sub substrate and the main substrate to each other.

The flexible substrate 130 has a stepped configuration, and connectors 131 and 132 are provided on the flexible substrate 130, one for each step. The height of the step of the flexible substrate 130 corresponds to the height difference between the sub substrate 90 and the main substrate 61 fixed in the housing 80. The connector 131 on the flexible substrate 130 is coupled to the connector 92 (see FIG. 13) on the sub substrate 90, and the connector 132 on the flexible substrate 130 is coupled to the connector 111 (see FIG. 13) on the main substrate 61. In this way, the sub substrate 90 and the main substrate 61 are electrically connected to each other via the flexible substrate 130.

Figure 17:
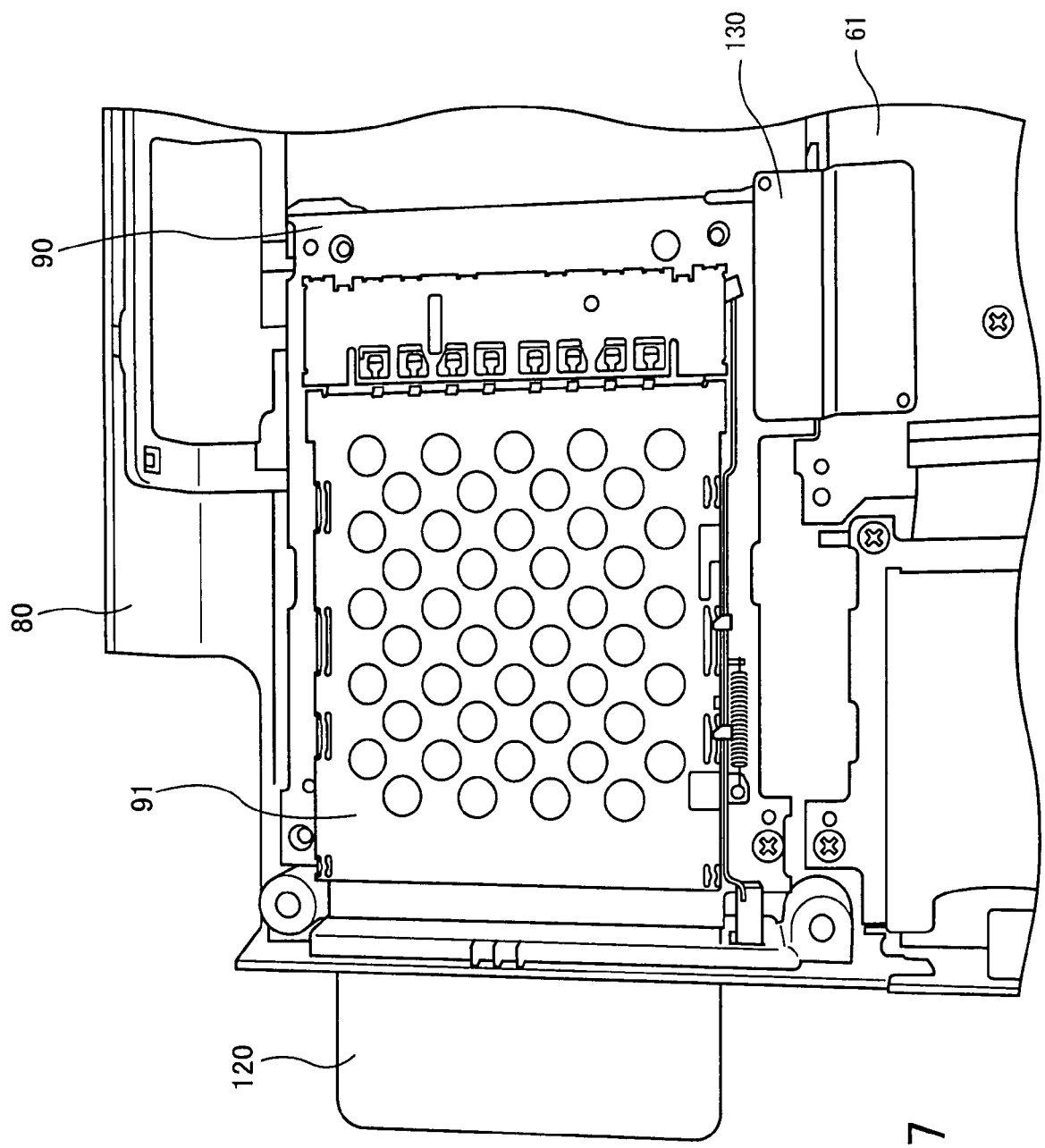
FIG. 17 shows a connector on the sub substrate and a connector on the main substrate connected to each other via the flexible substrate shown in FIG. 16.

FIG. 17 shows the connector on the sub substrate and the connector on the main substrate connected to each other via the flexible substrate shown in FIG. 16.

The two connectors on the flexible substrate 130 are coupled to the connector on the sub substrate 90 and the connector on the main substrate 61. FIG. 17 shows the back side of the flexible substrate 130, which is opposite to the side shown in FIG. 16.

Figure 18:
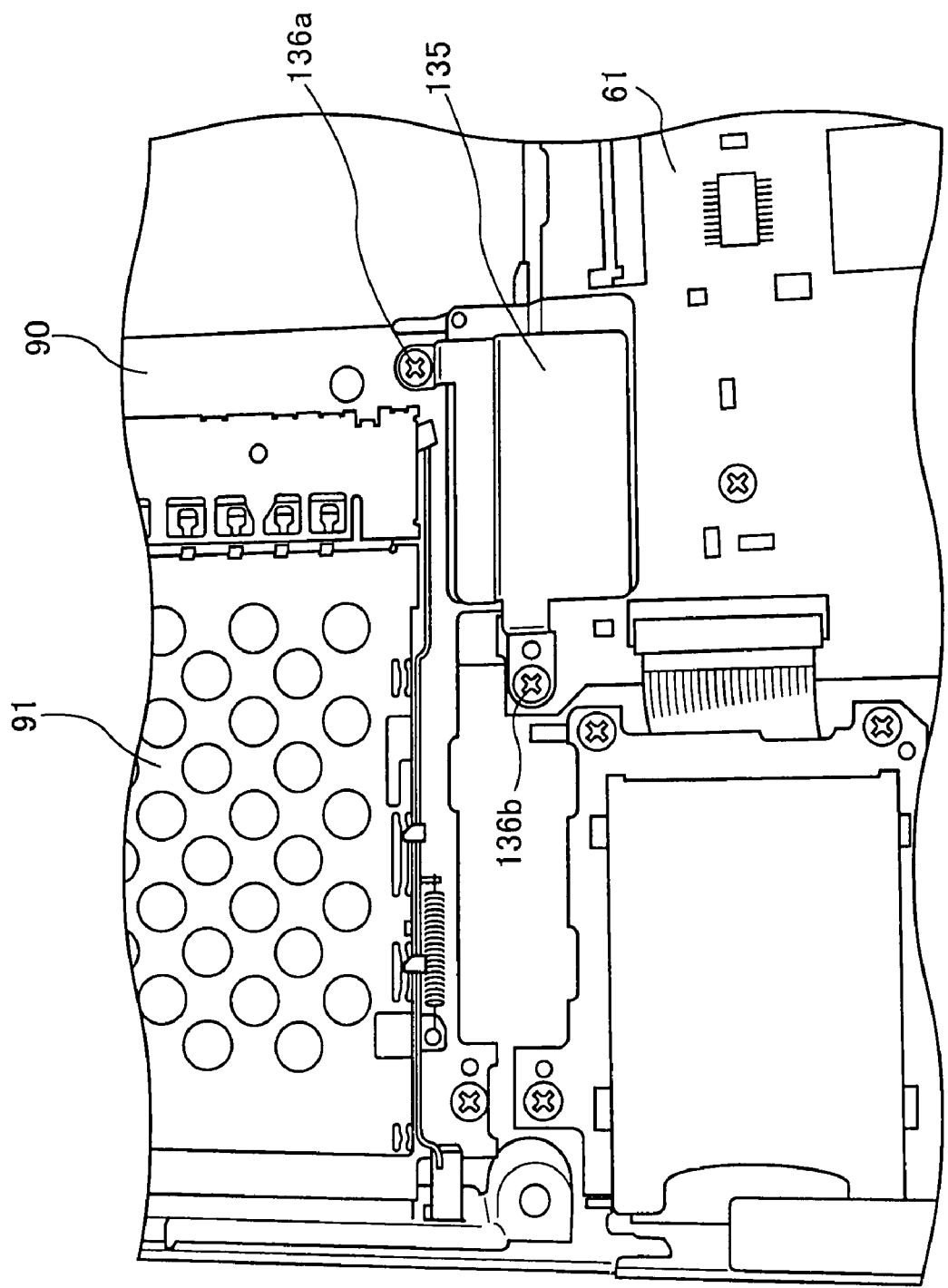
FIG. 18 shows the flexible substrate connecting the sub substrate and the main substrate to each other and held by a keep plate.

FIG. 18 shows the flexible substrate connecting the sub substrate and the main substrate to each other and held by a keep plate.

A keep plate 135 is made of a metal (steel) and is intended to prevent the flexible substrate 130 from unexpectedly dropping off and to firmly electrically connect a ground on the sub substrate 90 and a ground on the main substrate 61 to each other. The keep plate 135 is secured by two screws 136a and 136b and connected to the ground on the sub substrate 90 by the screw 136a and to the ground on the main substrate 61 by the screw 136b.

Figure 19:
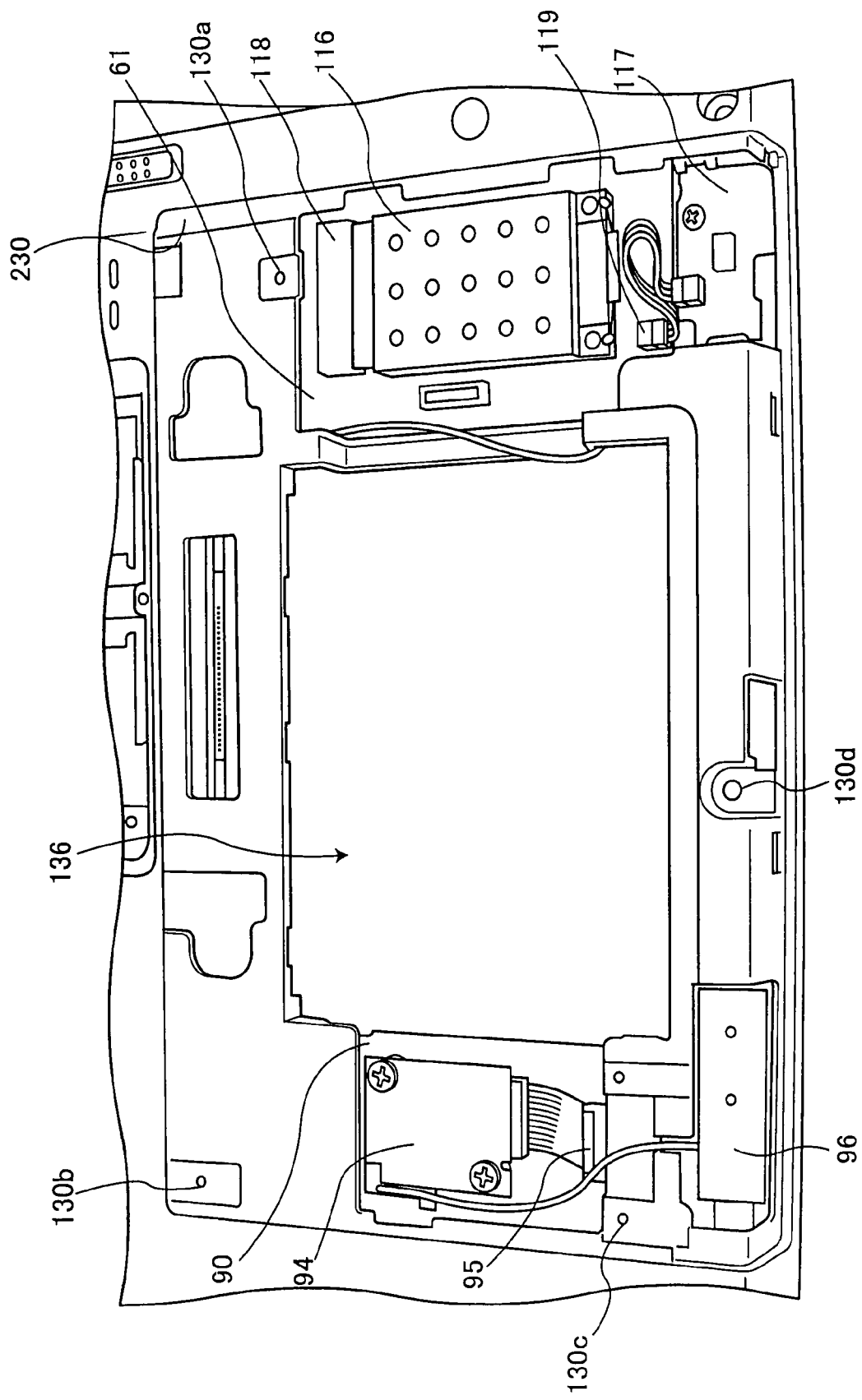
FIG. 19 shows the inside of an opening formed in the bottom surface of the slate PC (see FIG. 2) by removing a lid that covers the opening.

FIG. 19 shows the inside of the opening formed in the bottom surface of the slate PC (see FIG. 2) by removing the lid 23 that covers the opening.

The lid 23 shown in FIG. 2 is made of plastic, and the inner surface is plated. The lid 23 is screwed to the housing at four threaded parts 130a, 130b, 130c and 130d, which are part of the housing, and serves as an electrical shield in cooperation with the housing.

When the lid 23 is removed, in the approximate middle of the opening 230 in the housing, there can be seen a hard disk unit mounting part 136 on which a hard disk unit (not shown) is removably mounted. At the left of the opening 230 in FIG. 19, the Bluetooth module 94 mounted on the sub substrate 90 is exposed. In addition, at the left front of the opening 230 in FIG. 19, a Bluetooth antenna 96 connected to the Bluetooth module 94 is also arranged. The Bluetooth module 94 and the Bluetooth antenna 96 can be easily mounted and removed.

In addition, at the right of the opening 230 in FIG. 19, a wireless LAN module 116 mounted on the main substrate 61 is exposed. In addition, at the right front of the opening 230 in FIG. 19, a wireless LAN antenna 117 is also exposed.

The wireless LAN module 116 is connected to the main substrate 61 via a connector 118 and can easily mounted thereon and removed therefrom. The wireless LAN antenna 117 is connected to the main substrate 61 via a connector 119 and screwed to the housing and can be easily mounted thereon and removed therefrom.

The hard disk unit, the Bluetooth module 94 (including the Bluetooth antenna 96) and the wireless LAN module 116 (inducing the wireless LAN antenna 117) may not be mounted depending on the destination. According to this embodiment, the modules mounted on the separate two substrates, that is, the main substrate 61 and the sub substrate 90, and the hard disk unit are arranged in the single opening 230, and simply removing the single lid 23 (see FIG. 2) enables mounting and removal of these components. Thus, the arrangement can be easily adapted to the specifications of the destination.

According to the present embodiment, the position of the Bluetooth module 94 mounted on the sub substrate 90 and the position of the wireless LAN module 116 mounted on the main substrate 61 according to this embodiment correspond to a first component mounting part and a second component mounting part according to the present invention, respectively.

[Arrangement for Attaching Cooling Fan and Structure of Feat Radiator]

Figure 20:
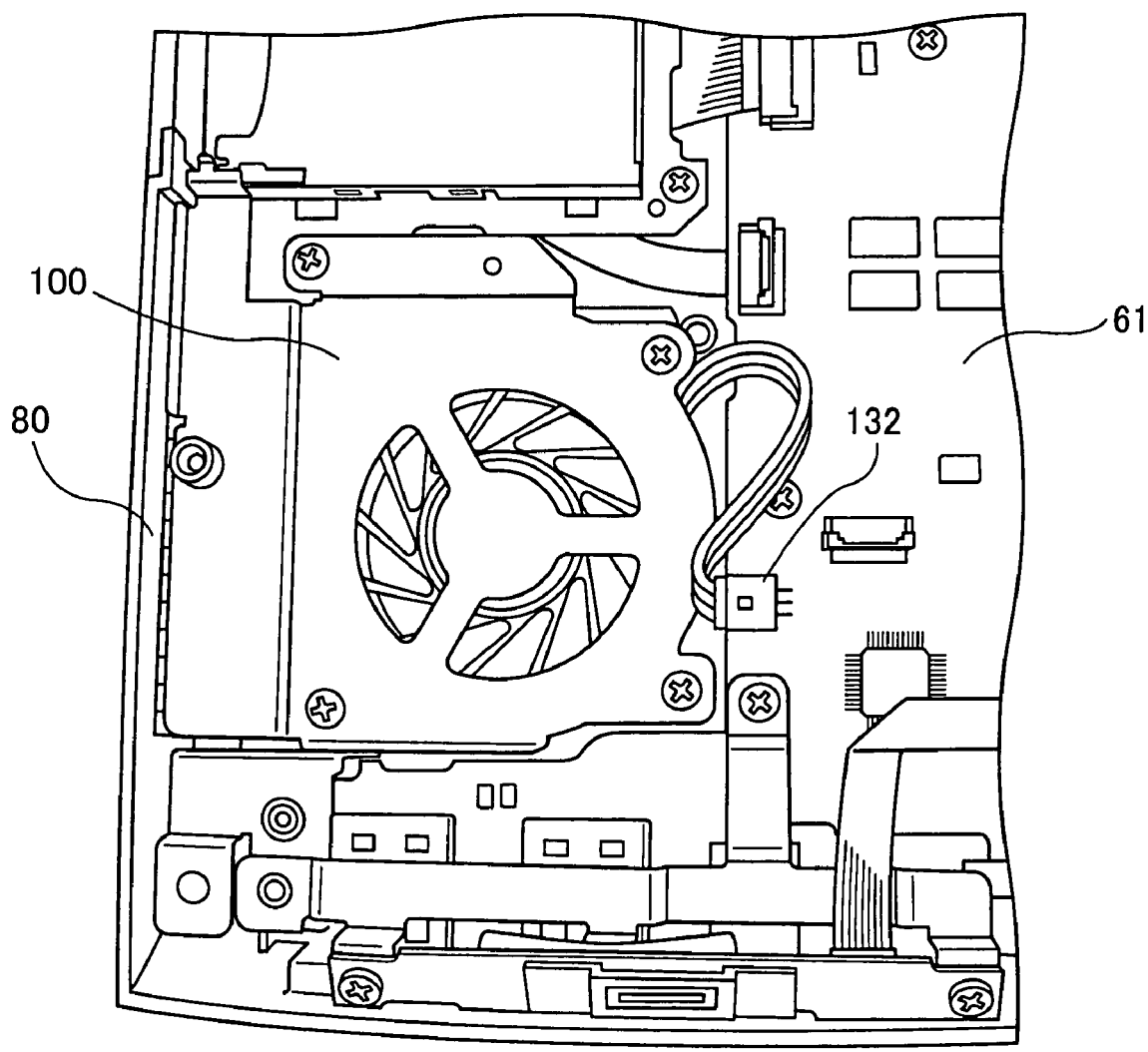
FIG. 20 is an enlarged view of a cooling fan in the housing shown in FIG. 12.

FIG. 20 is an enlarged view of the cooling fan 100 in the housing shown in FIG. 12.

The main substrate 61 is fixed in the housing 80 at a position spaced apart from the air exhaust port 44 shown in FIG. 4. The cooling fan 100 is disposed in the housing 80 in a space between the air exhaust opening 44 shown in FIG. 4 and the main substrate 61, screwed to the housing 80 and electrically connected to the main substrate 61 via the connector 132.

Part (A) of FIG. 21 shows the interior of the housing after the cooling fan is removed, and Part (B) of FIG. 21 shows the cooling fan removed from the housing. FIG. 22 is an exploded perspective view of the interior of the housing after the cooling fan is removed and the cooling fan removed from the housing.

In the housing 80, apart 151 of a heat radiator component 150 for supporting the bottom surface of the cooling fan 100 that faces the inside of the housing is exposed at the position where the cooling fan 100 is mounted. The heat radiator component 150 extends to a position immediately inside the air exhaust port 44 shown in FIG. 4, and a heat radiating fin 152 is disposed on the heat radiator component 150 at a position immediately inside the air exhaust port 44.

FIG. 23 shows the main substrate with the heat radiator component mounted thereon, removed from the housing, such that the surface of the main substrate facing the bottom of the housing (the surface opposite to that shown in FIGS. 21 and 22) faces upward in the figure. FIG. 24 is an exploded perspective view showing the same surface of the main substrate as shown in FIG. 23 and the heat radiator component after the heat radiator component is removed from the main substrate. Part (A) of FIG. 25 shows the same surface of the main substrate as shown in FIGS. 23 and 24 after the heat radiator component is removed, and Part (B) of FIG. 25 shows the surface of the heat radiator component intended to come into contact with the main substrate (the surface opposite to that shown in FIGS. 23 and 24).

As shown in FIGS. 23 to 25, in addition to the part 151 for supporting the cooling fan 100 and the heat radiating fin 152, the heat radiator component 150 has a first flat-plate heat receiving part 153 having a protrusion 153a extending toward the main substrate 61, a second flat-plate heat receiving part 154 and a part 155 for supporting the heat radiating fin 152 as well as a heat transfer pipe (heat transfer member) 156 that is fixed to a side of the first heat receiving part 153 at one end and in contact with the second heat receiving part 154 and extends to the heat radiating fin 152. The heat transfer pipe 156 serves to receive heat from the first heat receiving part 153 and the second heat receiving part 154 and efficiently transfer the heat to the heat radiating fin 152.

On the surface of the main substrate 61 on which the heat radiator component 150 is mounted, two heat generating components that require forced cooling, specifically, a chip set 143 and a CPU 144, are mounted. The protrusion 153a of the first heat receiving part 153 and the second heat receiving part 154 of the heat radiator component 150 are designed to come into intimate contact with the upper surfaces of the chip set 143 and the CPU 144, respectively, with a heat transferring paste or elastic material (rubber) (not shown) interposed therebetween.

The protrusion 153a of the first heat receiving part 153 is configured to compensate for the height difference between the chip set 143 and the CPU 144 on the main substrate 61, thereby making both the chip set 143 and the CPU 144 come into intimate contact with the heat radiator component 150. As shown in FIG. 25, the heat radiator component 150 has six screw holes 157a to 157f. Of the six screw holes 157a to 157f, five screw holes 157a to 157e are used to secure the heat radiator component 150 to the main substrate 61 by screws passing through five screw holes 145a to 145e penetrating the main substrate 61. The remaining one screw hole 157f is used for securing other components.

Heat generated by the chip set 143 and the CPU 144 is absorbed by the first heat receiving part 153 and the second heat receiving part 154 and transferred to the heat transfer pipe 156. The heat is further transferred to the heat radiating fin 152 via the heat transfer pipe 156. The heat radiating fin 152 receives the air supplied from the cooling fan 100, heat is transferred from the heat radiating fin 152 to the air, and the heated air is discharged to the outside through the air exhaust port 44 shown in FIG. 4.

As shown in FIGS. 20 and 22, the cooling fan 100 is disposed, on the heat radiator component 150 extending near the bottom of the housing, between the heat radiating fin 152 disposed immediately inside the air exhaust port 44 and the main substrate 61 and screwed to the housing 80. Therefore, the cooling fan 100 can be replaced without removing the main substrate 61 or the heat radiator component 150. Thus, the workability of replacing the cooling fan 100 is improved.

FIG. 26 shows the upper surface, which is the same surface as shown in FIG. 12 (the surface opposite to that shown in FIG. 23), of the main substrate removed from the housing. In FIG. 26, the heat transfer plate 110 is removed from the main substrate.

On the surface of the main substrate 61 shown in FIG. 26, an I/O controller 146, which is a heat generating component that requires forced cooling, is mounted.

The I/O controller 146 is in intimate contact with a heat receiving part 110a of the heat transfer plate 110 via a heat transferring adhesive (not shown) and secured to the main substrate 61 by screws fitted into screw holes 147a and 147b in the main substrate. Heat absorbed by the heat receiving part 110a of the heat transfer plate 110 is transferred to a heat transferring part 110b of the heat transfer plate 110. The heat transferring part 110b is secured to the heat radiator component 150 disposed on the opposite surface of the main substrate 61 by three screws 170a to 170c passing through the three screw holes 145a to 145c in the main substrate. Thus, the heat transferred to the heat transferring part 110b of the heat transfer plate 110 is transferred to the heat radiator component 150 fixed to the opposite surface of the main substrate 61 via the fixing screws. That is, the heat generated by the I/O controller 146 is transferred through the heat transfer plate 110 and the fixing screws 170a to 170c to the heat radiator component 150 fixed to the opposite surface of the main substrate 61 and then to the heat radiating fin 152 on the heat radiator component 150 through the heat radiator component 150 and discharged to the outside through the medium of the air supplied from the cooling fan 100.

As described above, according to this embodiment, heat generated by heat generating components mounted on either side of the main substrate 61 can be efficiently transferred and discharged even if the main substrate 61 is disposed in a narrow space.

What is claimed is:

1. An electronic device comprising:
   a metal housing with an opening;
   a metal lid that is attached to the housing so as to cover the opening;
   a first substrate that is fixed in the metal housing and is in a first plane parallel to the opening;
   two connectors parallel to each other, to each of which a second substrate different from the first substrate is inserted individually in opposite directions, the two connectors being fixed in the metal housing between the opening and the first substrate, in a second plane parallel to the opening, a predetermined space between the two connectors being preserved when in one of the two connectors or both the second substrate is inserted, the predetermined space not including any part of the one of the two connectors or both; and
   a metal plate member disposed in the predetermined space and fastened to the metal housing, to provide a resilient contact with a surface of the first substrate, thereby electrically connecting a ground of the first substrate to the metal housing, wherein
   the metal plate member includes a base part and two resilient contact pieces, the base part being disposed in the space such that the base part is spread parallel to the two connectors and both ends of the base part is fastened to the housing, the two resilient contact pieces being spread from the respective ends of the base part toward a substantial center of the base part while facing the first substrate so that tips of the resilient contact pieces contact the first substrate.

2. The electronic device according to claim 1, wherein the second substrate is a memory board mounted with a memory.

3. The electronic device according to claim 1, wherein the housing is made of a magnesium alloy.

4. The electronic device according to claim 1, wherein the electronic device is a mobile computer having a tabular form as a whole that houses in the housing an electronic circuit for data processing and has a display screen fixed to a surface of the computer.

5. A metal plate member that is employed in an electronic device, the electronic device comprising:
   a metal housing with an opening;
   a metal lid that is attached to the housing so as to cover the opening;
   a first substrate that is fixed in the metal housing and is in a first plane parallel to the opening; and
   two connectors parallel to each other, to each of which a second substrate different from the first substrate is inserted individually in opposite directions, the two connectors being fixed in the metal housing between the opening and the first substrate in a second plane parallel to the opening, a predetermined space between the two connectors being preserved when in one of the two connectors or both the second substrate inserted, the predetermined space not including any part of the one of the two connectors or both,
   wherein the metal plate member is disposed in the predetermined space and fastened to the metal housing to provide a resilient contact with a surface of the first substrate, thereby the metal plate member electrically connecting a ground of the first substrate to the metal housing, and wherein the metal plate member further comprises:

a base part disposed at the space such that the base part is spread parallel to the two connectors and both ends of the base part are fastened to the housing; and two resilient contact pieces being spread from the respective ends of the base part toward a substantial center of the base part while facing the first substrate so that tips of the respective resilient contact pieces contact the first substrate.

* * * * *